(12) United States Patent
No et al.

(10) Patent No.: US 10,204,564 B2
(45) Date of Patent: Feb. 12, 2019

(54) DISPLAY DEVICE

(71) Applicant: SAMSUNG DISPLAY CO., LTD., Yongin-si, Gyeonggi-do (KR)

(72) Inventors: Sangyong No, Seoul (KR); Jiho Moon, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 215 days.

(21) Appl. No.: 15/234,441

(22) Filed: Aug. 11, 2016

(65) Prior Publication Data

US 2017/0200420 A1    Jul. 13, 2017

(30) Foreign Application Priority Data

Dec. 30, 2015  (KR) .................. 10-2015-0190151

(51) Int. Cl.
| | | |
|---|---|---|
| *H01L 27/12* | (2006.01) | |
| *G09G 3/3275* | (2016.01) | |
| *G09G 3/36* | (2006.01) | |
| *G06F 13/16* | (2006.01) | |
| *G11C 19/28* | (2006.01) | |
| *G02F 1/1345* | (2006.01) | |
| *G02F 1/136* | (2006.01) | |

(52) U.S. Cl.
CPC ....... *G09G 3/3275* (2013.01); *G06F 13/1689* (2013.01); *G09G 3/3677* (2013.01); *G11C 19/287* (2013.01); *G02F 1/13452* (2013.01); *G02F 2001/13606* (2013.01); *G09G 2300/0426* (2013.01); *G09G 2320/0219* (2013.01)

(58) Field of Classification Search
CPC .............. G09G 3/3275; G09G 3/3677; G09G 2320/0219; G09G 2300/0426
See application file for complete search history.

(56) References Cited

U.S. PATENT DOCUMENTS

| | | | |
|---|---|---|---|
| 2002/0126081 A1* | 9/2002 | Adachi | G09G 3/3655 345/92 |
| 2005/0104647 A1 | 5/2005 | Choi et al. | |
| 2006/0139274 A1* | 6/2006 | Song | G02F 1/1395 345/90 |
| 2006/0279511 A1* | 12/2006 | Uh | G11C 19/184 345/100 |
| 2009/0167654 A1 | 7/2009 | Kim et al. | |
| 2011/0012887 A1 | 1/2011 | Lee et al. | |
| 2016/0240158 A1* | 8/2016 | Xu | G11C 19/28 |
| 2017/0062532 A1* | 3/2017 | Jeong | H01L 27/3246 |

FOREIGN PATENT DOCUMENTS

| | | |
|---|---|---|
| KR | 1020030028974 A | 4/2003 |
| KR | 1020060128271 A | 12/2006 |
| KR | 1020090073771 A | 7/2009 |
| KR | 1020110006770 A | 1/2011 |

* cited by examiner

*Primary Examiner* — Abbas I Abdulselam
(74) *Attorney, Agent, or Firm* — Cantor Colburn LLP

(57) ABSTRACT

A display device includes a first substrate and a second substrate opposite to each other, a gate line on the first substrate, a gate driver which is connected to the gate line, a clock line which transmits a clock signal, a connecting line which connects the clock line and the gate driver, a common electrode on the second substrate, the common electrode overlapping the clock line and the connecting line, and a compensation pattern which overlaps the common electrode and extends from the connecting line.

23 Claims, 10 Drawing Sheets

DISPLAY DEVICE

This application claims priority to Korean Patent Application No. 10-2015-0190151, filed on Dec. 30, 2015, and all the benefits accruing therefrom under 35 U.S.C. § 119, the content of which in its entirety is herein incorporated by reference.

BACKGROUND

1. Field

Exemplary embodiments of the invention relate to a display device, and more particularly, to a display device which significantly reduces ripples of a common voltage.

2. Description of the Related Art

A liquid crystal display ("LCD") device is a type of flat panel display ("FPD"), which has wide applications recently. The LCD device generally includes two substrates including two electrodes respectively formed thereon and a liquid crystal layer interposed therebetween. Upon applying voltage to the two electrodes, liquid crystal molecules of the liquid crystal layer are rearranged in the LCD device, such that an amount of transmitted light may be adjusted.

The LCD device also includes gate lines which are driven by a gate driver. The gate driver receives clock signals from clock lines to thereby generate gate signals.

SUMMARY

Due to a coupling phenomenon between a clock signal applied to clock lines and a common voltage applied to a common electrode, a common voltage may have ripples. In the case that the common voltage has ripples, image quality may be degraded, and thereby horizontal lines appear on a screen of a display device.

Exemplary embodiments of the invention are directed to a display device which significantly reduces ripples of a common voltage.

According to an exemplary embodiment of the invention, a display device includes a first substrate and a second substrate opposite to each other, a gate line on the first substrate, a gate driver which is connected to the gate line, a clock line which transmits a clock signal, a connecting line which connects the clock line and the gate driver, a common electrode on the second substrate, the common electrode overlapping the clock line and the connecting line, and a compensation pattern which overlaps the common electrode and extends from the connecting line.

In an exemplary embodiment, the clock line, the connecting line, and the compensation pattern may respectively include a plurality of clock lines, a plurality of connecting lines, and a plurality of compensation patterns which are connected to one another, respectively, in one-to-one correspondence, and the compensation patterns corresponding to respective connecting lines of the plurality of connecting lines may have different planar areas from one another.

In an exemplary embodiment, the clock line may be electrically connected to a compensation pattern that has a larger planar area, as the clock line is closer to the gate driver.

In an exemplary embodiment, the display device may further include a base line between the gate driver and a clock line that is closest to the gate driver, the base line connected to the gate driver. The compensation pattern may be on an insulating layer between the clock line that is closest to the gate driver and the base line.

In an exemplary embodiment, the compensation pattern may not overlap the clock line and the base line.

In an exemplary embodiment, at least one hole may be defined by the connecting line and the compensation pattern.

In an exemplary embodiment, at least one hole may be defined by the compensation pattern.

In an exemplary embodiment, the compensation pattern may have one of a linear shape and an L-like shape.

In an exemplary embodiment, the compensation pattern may have a line width greater than or equal to a line width of the connecting line.

In an exemplary embodiment, the compensation pattern may be on a same layer as that on which the connecting line is disposed.

In an exemplary embodiment, the connecting lines may have curved portions, respectively.

In an exemplary embodiment, the clock line may be connected to a curved portion that has a longer length, as the clock line is closer to the gate driver.

In an exemplary embodiment, the connecting lines may have substantially the same resistance with each other.

In an exemplary embodiment, the clock line may overlap a greater number of the connecting lines, as the clock line is closer to the gate driver.

According to another exemplary embodiment of the invention, a display device includes a first substrate and a second substrate opposite to each other, a gate line on the first substrate, a gate driver which is connected to the gate line, a clock line which transmits a clock signal, a connecting line which connects the clock line and the gate driver, a common electrode on the second substrate, the common electrode overlapping the clock line and the connecting line, and a compensation pattern which overlaps the common electrode and extends from the clock line.

In an exemplary embodiment, the clock line, the connecting line, and the compensation pattern may respectively include a plurality of clock lines, a plurality of connecting lines, and a plurality of compensation patterns which are connected to one another, respectively, in one-to-one correspondence, and the plurality of compensation patterns respectively corresponding to the plurality of clock lines may have different planar areas from one another.

In an exemplary embodiment, the clock line may be electrically connected to a compensation pattern that has a larger planar area, as the clock line is closer to the gate driver.

In an exemplary embodiment, each of the compensation patterns may be disposed between adjacent clock lines of the plurality of clock lines.

In an exemplary embodiment, the compensation pattern may have a line width greater than or equal to a line width of the clock line.

In an exemplary embodiment, the compensation pattern may be on a same layer as that on which the clock line is disposed.

According to another exemplary embodiment of the invention, a display device includes a first substrate and a second substrate opposite to each other, a gate line on the first substrate, a gate driver which is connected to the gate line, a clock line which transmits a clock signal, a connecting line which connects the clock line and the gate driver, a common electrode on the second substrate, the common electrode overlapping the clock line and the connecting line, a first compensation pattern which overlaps the common electrode and extends from the connecting line, and a second compensation pattern which overlaps the common electrode and extends from another clock line.

In an exemplary embodiment, one of the first compensation pattern and the second compensation pattern connected to a clock line that is closer to the gate driver may have a larger planar area than that of the other of the first compensation pattern and the second compensation pattern.

In an exemplary embodiment, the odd-numbered clock line may be connected to one of the first compensation pattern and the second compensation pattern, and the even-numbered clock line may be connected to the other of the first compensation pattern and the second compensation pattern.

The foregoing is illustrative only and is not intended to be in any way limiting. In addition to the illustrative exemplary embodiments, and features described above, further exemplary embodiments, and features will become apparent by reference to the drawings and the following detailed description.

BRIEF DESCRIPTION OF THE DRAWINGS

The above and other features and exemplary embodiments of the invention will be more clearly understood from the following detailed description taken in conjunction with the accompanying drawings, in which.

DETAILED DESCRIPTION

Figure 1:
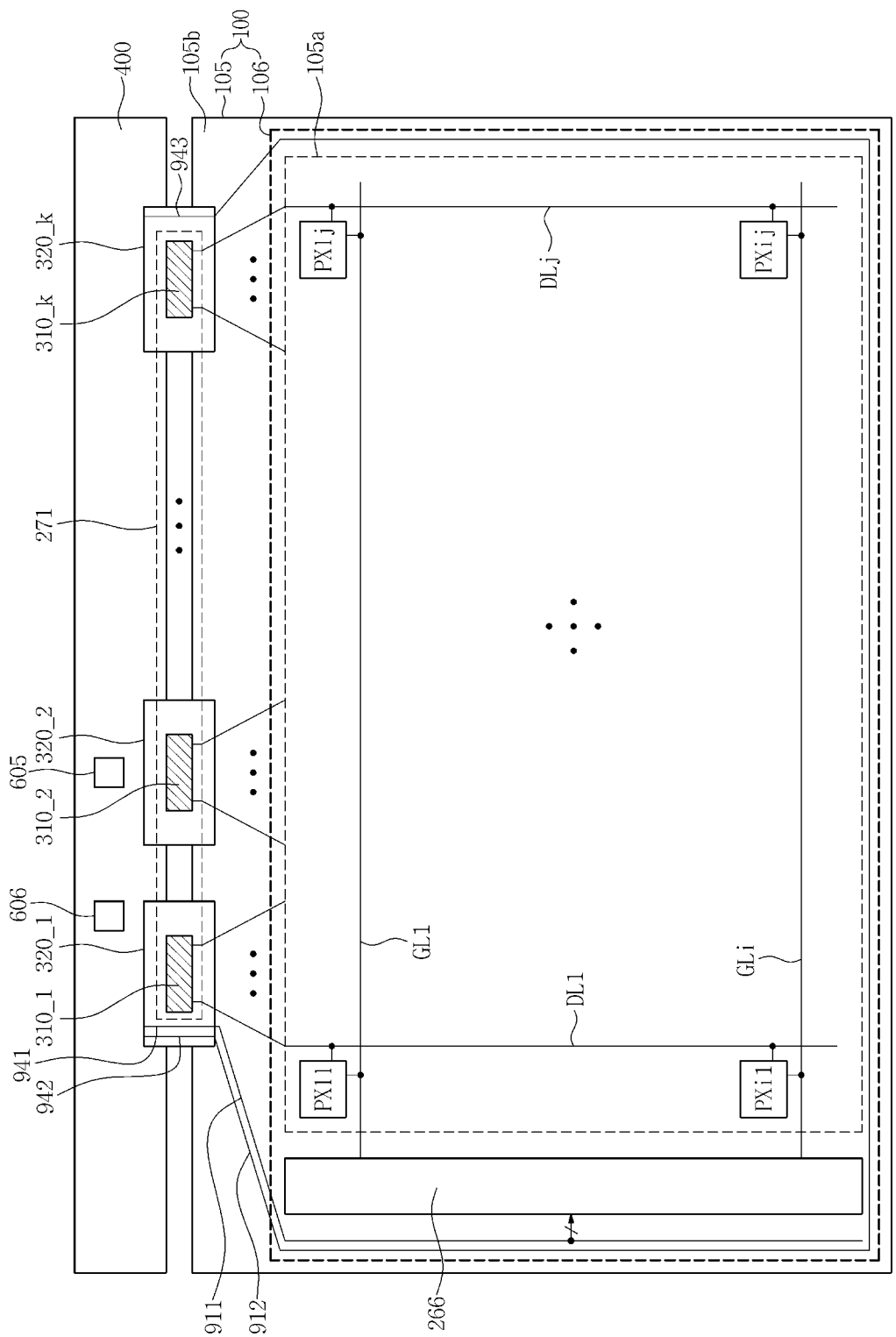
FIG. 1 is a view illustrating an exemplary embodiment of a display device.

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Therefore, well-known constituent elements, operations and techniques are not described in detail in the exemplary embodiments in order to prevent the invention from being obscurely interpreted. Like reference numerals refer to like elements throughout the specification.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, exemplary embodiments of a display device will be described in detail with reference to FIGS. 1 to 10.

FIG. 1 is a view illustrating an exemplary embodiment of a display device.

An exemplary embodiment of the display device, as illustrated in FIG. 1, includes a display panel 100, a data driver 271, a gate driver 266, a circuit board 400, a timing controller 606, and a power supply unit 605.

The display panel 100 includes a first panel 105 and a second panel 106. The first panel 105 and the second panel 106 face each other. The first display panel 105 includes a display area 105a and a non-display area 105b.

The display panel 100 may be a panel that is used in various display devices such as a liquid crystal display ("LCD") panel or an organic light emitting diode ("OLED") panel. In the case that the display panel 100 is an LCD panel, a liquid crystal layer may be disposed between the first panel 105 and the second panel 106. In the case that the display panel 100 is an OLED panel, an organic light emitting layer may be disposed between the first panel 105 and the second panel 106.

The first panel 105 includes a plurality of gate lines GL1 to GLi, a plurality of data lines DL1 to DLj, a common line 912, and a plurality of pixels PX11 to PXij, where i and j are natural numbers greater than 1. The gate lines GL1 to GLi, the data lines DL1 to DLj, and the pixels PX11 to PXij are disposed on a first substrate 401 (refer to FIGS. 4 and 5) of the first panel 105.

The second panel 106 includes a light blocking layer which defines a pixel area. In an exemplary embodiment, the light blocking layer may be disposed on the first panel 105. The light blocking layer prevents light from being emitted toward a portion except for the pixel area.

The data lines DL1 to DLj intersect the gate lines GL1 to GLi. The data lines DL1 to DLj extend to the non-display area 105b to be connected to the data driver 271.

The data driver 271 includes a plurality of data driving integrated circuits ("ICs") 310_1, 310_2, . . . , and 310_k, where k is a natural number greater than 1. The data driving ICs 310_1, 310_2, . . . , and 310_k receive digital image data signals and a data control signal applied from a timing controller 606. The data driving ICs 310_1, 310_2, . . . , and 310_k sample the digital image data signals according to the data control signal, latch the sampled digital image data signals corresponding to one horizontal line in each horizontal period, and apply the latched image data signals to the data lines DL1 to DLj. That is, the data driving ICs 310_1, 310_2, . . . , and 310_k convert the digital image data signals applied from the timing controller 606 into analog image signals using a gamma voltage input from a power supply unit 605 and apply the converted analog image signals to the data lines DL1 to DLj.

The data driving ICs 310_1, 310_2, . . . , and 310_k are disposed (e.g., mounted) on data carriers 320_1, 320_2, . . . , and 320_k, respectively. The data carriers 320_1, 320_2, . . . , and 320_k are connected between the circuit board 400 and the display panel 105. In an exemplary embodiment, each of the data carriers 320_1, 320_2, . . . , and 320_k may be electrically connected between the circuit board 400 and the non-display area 105b of the display panel 105, for example.

The timing controller 606 and the power supply unit 605 described above may be disposed on the circuit board 400.

The data carriers 320_1, 320_2, . . . , and 320_k include input lines which transmit various signals applied from the timing controller 606 and the power supply unit 605 to the data driving ICs 310_1, 310_2, . . . , and 310_k and output lines which transmit image data signals output from the data driving ICs 310_1, 310_2, . . . , and 310_k to the corresponding data lines DL1 to DLj, respectively.

A data carrier at a leftmost edge, e.g., the data carrier 320_1, may include a first auxiliary line 941 and a second auxiliary line 942 which transmit various signals and a common voltage applied from the timing controller 606 and the power supply unit 605 to the first panel 105.

A data carrier at a rightmost edge, e.g., the data carrier 320_k, may include a third auxiliary line 943 which transmits the common voltage applied from the power supply unit 605 to the first panel 105.

The first auxiliary line 941 is connected to the gate control line 911 of the first panel 105. The gate control line 911 transmits various signals applied through the first auxiliary line 941 to the gate driver 266.

The common line 912 transmits the common voltage applied from the second and third auxiliary lines 942 and 943 to a common electrode of the second panel 106. The common line 912 may have a shape enclosing three sides of the display area 105a. The common electrode of the second panel 106 is connected to the common line 912 of the first panel 105 through a short-circuit unit (not illustrated). The common electrode receives the common voltage from the common line 912 through the short-circuit unit.

In an exemplary embodiment, the gate control line 911 and the common line 912 may be provided in the non-display area 105b of the first panel 105 in a line-on-glass manner, for example.

The pixels PX11 to PXij are arranged in a matrix in the display area 105a of the first panel 105. In an exemplary embodiment, the pixels PX11 to PXij include a red pixel displaying a red image, a green pixel displaying a green image, and a blue pixel displaying a blue image, for example. In such an exemplary embodiment, the red pixel, the green pixel, and the blue pixel that are adjacently disposed in a horizontal direction may define a unit pixel for displaying a unit image. However, the invention is not limited thereto, and the pixels PX11 to PXij may include various other color pixels.

There are "j" number of pixels arranged along a $p^{th}$ horizontal line (hereinafter, also referred to as "$p^{th}$ horizontal line pixels"), which are connected to the first to $j^{th}$ data lines DL1 to DLj, respectively, where p is a number selected from 1 to i. Further, the $p^{th}$ horizontal line pixels are commonly connected to the $p^{th}$ gate line. Accordingly, the $p^{th}$ horizontal line pixels receive a $p^{th}$ gate signal as a common signal. That is, "j" number of pixels disposed in the same horizontal line receive the same gate signal, while pixels disposed in different horizontal lines receive different gate signals, respectively.

Each of the pixels PX11 to PXij, although not illustrated, includes a pixel transistor, a liquid crystal capacitor, and a storage capacitor. In an exemplary embodiment, the pixel transistor is a thin film transistor, for example. However, the invention is not limited thereto, and the pixel transistor may include various other types of transistors.

The pixel transistor is turned on according to a gate signal applied from the gate line. The turned-on pixel transistor applies the analog image data signal applied from the data line to the liquid crystal capacitor and the storage capacitor.

The liquid crystal capacitor includes a pixel electrode and a common electrode which are opposite to each other.

The storage capacitor includes a pixel electrode and an opposing electrode which are opposite to each other. Herein, the opposing electrode may be a previous gate line or a transmission line which transmits a common voltage.

The gate lines GL1 to GLi are driven by the gate driver 266 including a shift register.

Figure 2:
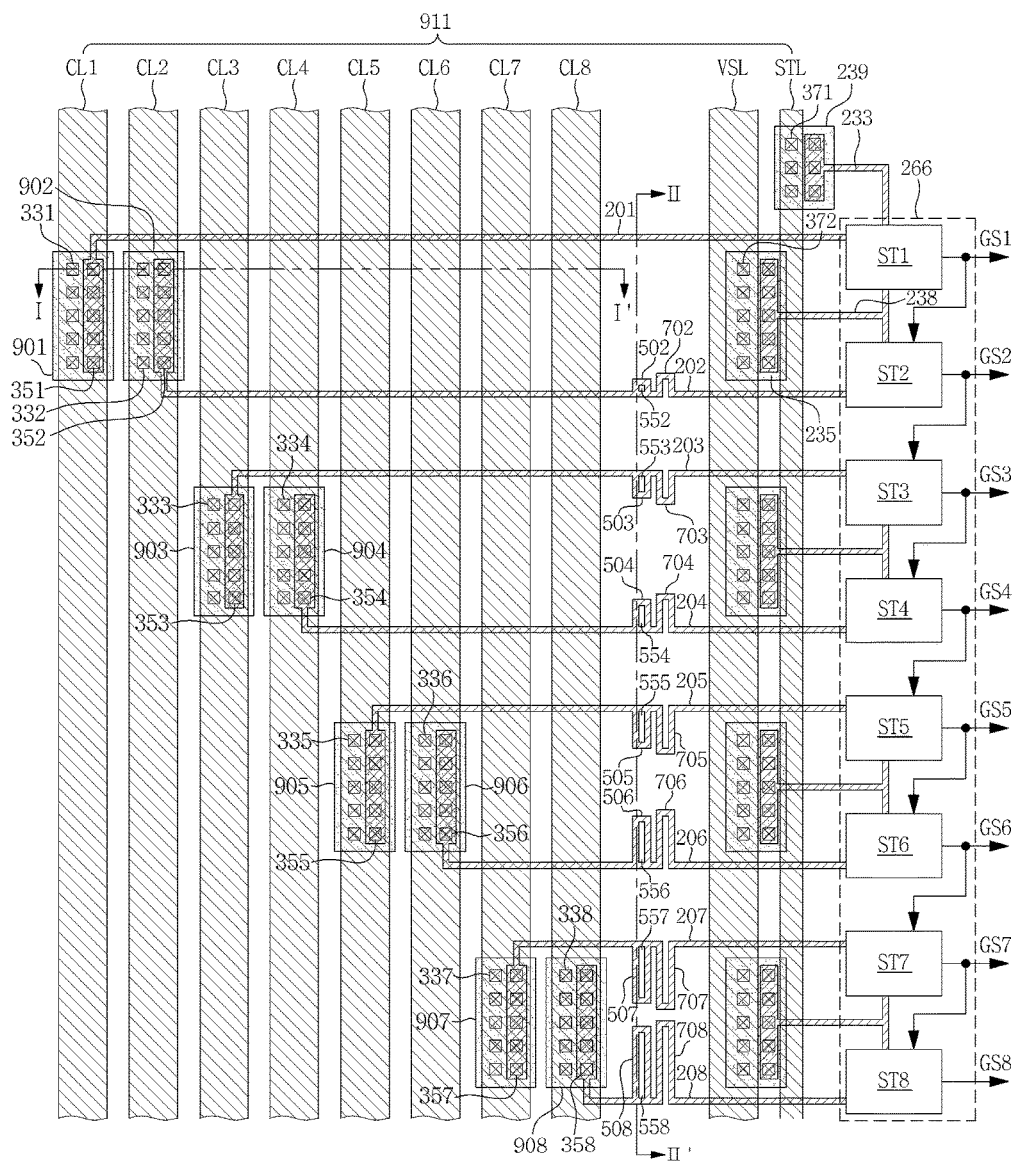
FIG. 2 is a view illustrating an exemplary embodiment of a connecting relationship between a gate control line and a gate driver of FIG. 1.
Figure 3:
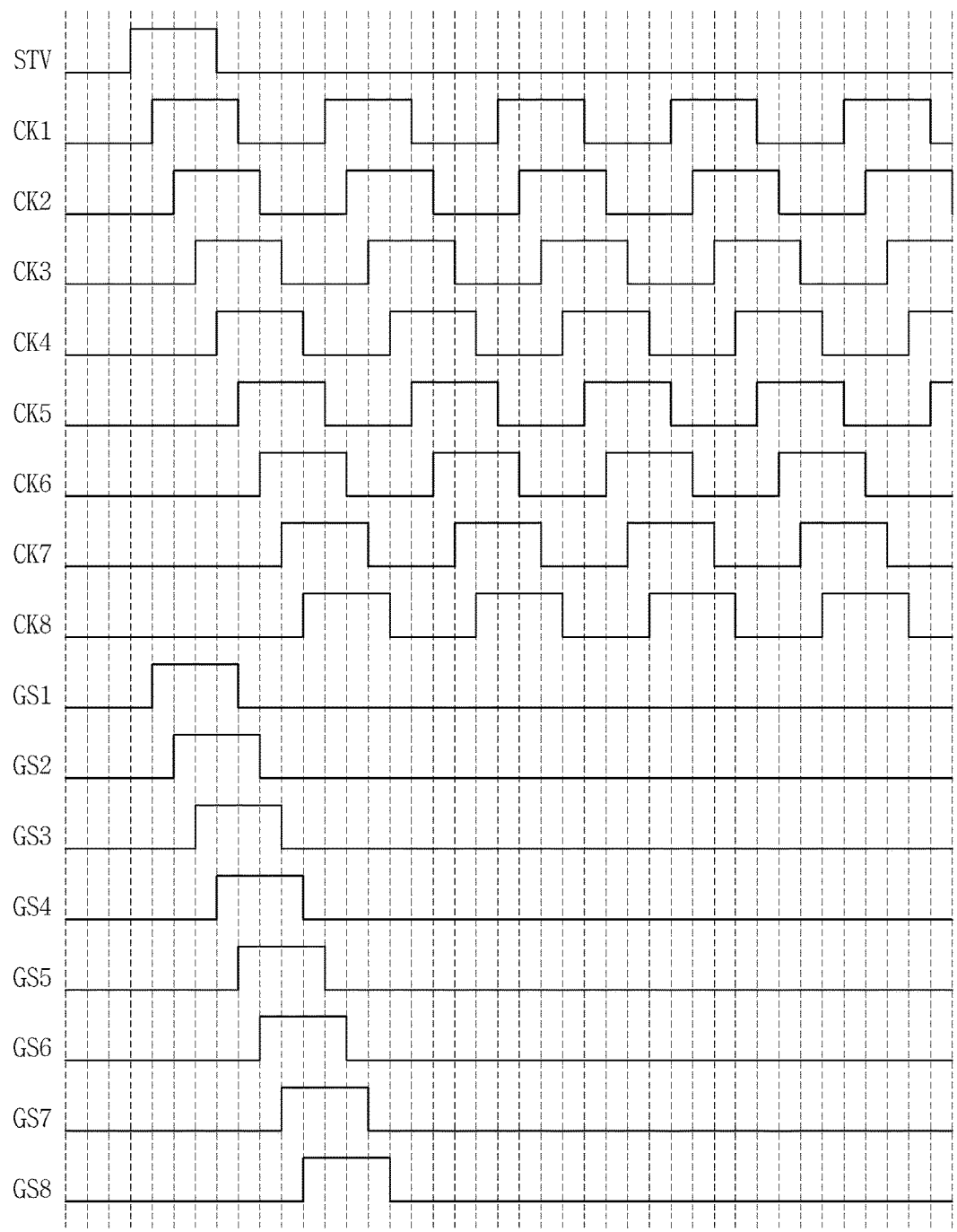
FIG. 3 is a view illustrating waveforms of various signals applied to the gate control line of FIG. 2 and gate signals output from the gate driver of FIG. 2.

FIG. 2 is a view illustrating an exemplary embodiment of a connecting relationship between the gate control line 911 and the gate driver 266 of FIG. 1, and a portion of the gate control line 911 and a portion of the gate driver 266 are illustrated in FIG. 2. FIG. 3 is a view illustrating waveforms of various signals applied to the gate control line 911 of FIG. 2 and gate signals output from the gate driver 266 of FIG. 2.

The gate control line 911, as illustrated in FIG. 2, includes a first clock line CL1, a second clock line CL2, a third clock line CL3, a fourth clock line CL4, a fifth clock line CL6, a seventh clock line CL7, an eighth clock line CL8, a base line VSL, and a start line STL.

As illustrated in FIG. 3, the first, second, third, fourth, fifth, sixth, seventh, and eighth clock lines CL1, CL2, CL3, CL4, CL5, CL6, CL7, and CL8 transmit first, second, third, fourth, fifth, sixth, seventh, and eighth clock signals CK1, CK2, CK3, CK4, CK5, CK6, CK7, and CK8, respectively, and the start line STL transmits a start vertical signal STV. The first, second, third, fourth, fifth, sixth, seventh, and eighth clock signals CK1, CK2, CK3, CK4, CK5, CK6, CK7, and CK8 and the start vertical signal STV are applied from the timing controller 606. A high voltage of each of the first, second, third, fourth, fifth, sixth, seventh, and eighth clock signals CK1, CK2, CK3, CK4, CK5, CK6, CK7, and CK8 corresponds to a high voltage of the gate signal.

As illustrated in FIG. 3, the first, second, third, fourth, fifth, sixth, seventh, and eighth clock signals CK1, CK2, CK3, CK4, CK5, CK6, CK7, and CK8 are output sequentially, and in particular, are output recursively. That is, the first, second, third, fourth, fifth, sixth, seventh, and eighth clock signals CK1, CK2, CK3, CK4, CK5, CK6, CK7, and CK8 are output sequentially from the first clock signal CK1 to the eighth clock signal CK8, and repetitively output sequentially from the first clock signal CK1 to the eighth clock signal CK8.

High periods of the clock signals that are output in adjacent periods, respectively, may overlap each other. In an exemplary embodiment, as illustrated in FIG. 3, a high period corresponding to latter three fourths of a pulse width of the first clock signal CK1 and a high period corresponding to former three fourths of a pulse width of the second clock signal CK2 overlap each other in time, for example.

As illustrated in FIG. 3, the fifth, sixth, seventh, and eighth clock signals CK5, CK6, CK7, and CK8 have phases that are inverted, i.e., shifted by 180 degrees, with respect to the first, second, third, and fourth clock signals CK1, CK2, CK3, and CK4, respectively. In an exemplary embodiment, the fifth clock signal CK5 is inverted, i.e., shifted by 180 degrees, with respect to the first clock signal CK1, the sixth clock signal CK6 is inverted, i.e., shifted by 180 degrees, with respect to the second clock signal CK2, the seventh clock signal CK7 is inverted, i.e., shifted by 180 degrees, with respect to the third clock signal CK3, and the eighth clock signal CK8 is inverted, i.e., shifted by 180 degrees, with respect to the fourth clock signal CK4, for example.

While each of the first, second, third, fourth, fifth, sixth, seventh, and eighth clock signals CK1, CK2, CK3, CK4, CK5, CK6, CK7, and CK8 is output a plurality of times in a single frame period, the start vertical signal STV is output only one time in a single frame period. In other words, while each of the first, second, third, fourth, fifth, sixth, seventh, and eighth clock signals CK1, CK2, CK3, CK4, CK5, CK6, CK7, and CK8 has an active state (high voltage) a plurality of times periodically in a single frame, the start vertical signal STV has an active state (high voltage) only one time in a single frame period.

The gate driver 266, as illustrated in FIG. 2, is disposed in the non-display area 105b of the first panel 105. The gate driver 266 includes a shift register. The shift register includes a plurality of stages ST1, ST2, ST3, ST4, ST5, ST6, ST7, and ST8.

In an exemplary embodiment, each of the stages ST1, ST2, ST3, ST4, ST5, ST6, ST7, and ST8 receives one of the first, second, third, fourth, fifth, sixth, seventh, and eighth clock signals CK1, CK2, CK3, CK4, CK5, CK6, CK7, and CK8 to thereby generate first, second, third, fourth, fifth, sixth, seventh, and eighth gate signals GS1, GS2, GS3, GS4, GS5, GS6, GS7, and GS8. An $8m+1^{th}$ stage (e.g., a stage ST1) receives the first clock signal CK1 to thereby generate a gate signal, an $8m+2^{th}$ stage (e.g., a stage ST2) receives the second clock signal CK2 to thereby generate a gate signal, an $8m+3^{th}$ stage (e.g., a stage ST3) receives the third clock signal CK3 to thereby generate a gate signal, an $8m+4^{th}$ stage (e.g., a stage ST4) receives the fourth clock signal CK4 to thereby generate a gate signal, an $8m+5^{th}$ stage (e.g., a stage ST5) receives the fifth clock signal CK5 to thereby generate a gate signal, an $8m+6^{th}$ stage (e.g., a stage ST6) receives the sixth clock signal CK6 to thereby generate a gate signal, an $8m+7^{th}$ stage (e.g., a stage ST7) receives the seventh clock signal CK7 to thereby generate a gate signal, and an $8m+8^{th}$ stage (e.g., a stage ST8) receives the eighth clock signal CK8 to thereby generate a gate signal. As used herein, "m" is a natural number including 0.

Each of the stages ST1, ST2, ST3, ST4, ST5, ST6, ST7, and ST8 receives the gate signal applied from a previous stage as an initiating signal and thereby is set. The stage that is set outputs, as a gate signal, the clock signal that is applied to the corresponding stage that is set. In an exemplary embodiment, the second stage ST2 receives the first gate signal GS1 from the first stage ST1 as an initiating signal and thereby is set, for example. The second stage ST2 that is set receives the second clock signal CK2 and outputs the second gate signal GS2.

Although not illustrated, each of the stages ST1, ST2, ST3, ST4, ST5, ST6, ST7, and ST8 receives the gate signal applied from a succeeding stage and thereby is reset.

The first stage ST1 which is driven firstly in each frame period receives the start vertical signal STV as an initiating signal. In addition, although not illustrated, a stage that is driven lastly in each frame period also receives the start vertical signal STV. The stage that is driven lastly in each frame period receives the start vertical signal STV and thereby is reset.

As described above, the gate driver 266 may receive clock signals of eight phases, e.g., the first, second, third, fourth, fifth, sixth, seventh, and eighth clock signals CK1, CK2, CK3, CK4, CK5, CK6, CK7, and CK8, but the number of phases of the clock signal is not limited thereto. That is, the gate driver 266 may receive "q" number of clock signals, where "q" is a natural number greater than 1.

A compensation pattern will be described further in detail with reference to FIGS. 4 and 5, along with FIG. 2 described above.

Figure 4:
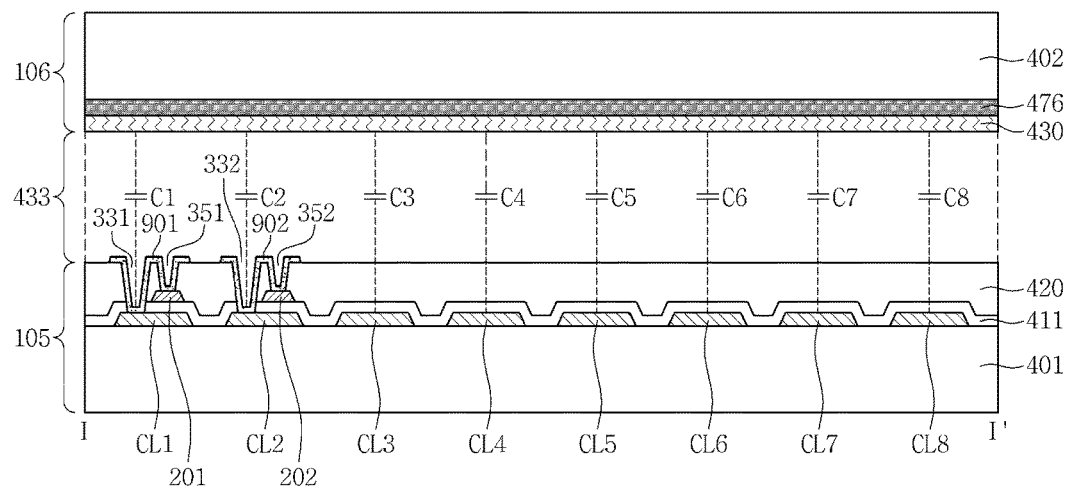
FIG. 4 is a cross-sectional view taken along line I-I' of FIG. 2.
Figure 5:
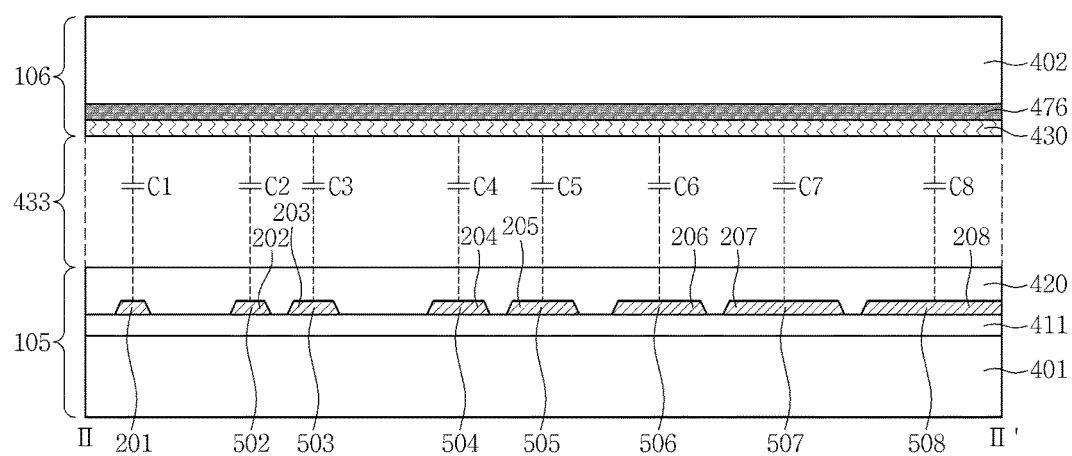
FIG. 5 is a cross-sectional view taken along line II-II' of FIG. 2.

FIG. 4 is a cross-sectional view taken along line I-I' of FIG. 2, and FIG. 5 is a cross-sectional view taken along line II-IP of FIG. 2.

The first clock line CL1, as illustrated in FIGS. 2 and 4, is connected to the gate driver 266 through a first connecting line 201. In an exemplary embodiment, the first connecting line 201 connects the first clock line CL1 and the first stage ST1 of the gate driver 266, for example. The first clock line CL1 transmits the first clock signal CK1.

Although not illustrated, a compensation pattern may extend or protrude from the first connecting line 201. Hereinafter, the compensation pattern extending (or protruding) from the first connecting line 201 will be defined as "first source compensation pattern." The first source compensation pattern, along with the first connecting line 201, may define a hole. In other words, the first hole is enclosed by the first source compensation pattern, having a U-shape, for example, and a linear portion of the first connecting line 201. However, the invention is not limited thereto, and the first source compensation pattern may have various other shapes.

The first source compensation pattern and the first connecting line 201 may be unitary with each other.

As illustrated in FIG. 4, the first clock line CL1 and the first connecting line 201 are disposed in different layers, respectively. The first clock line CL1 and the first connecting line 201 are connected to each other by a first conductive layer 901. A portion of the first conductive layer 901 is connected to the first clock line CL1 through a first gate contact hole 331, and another portion of the first conductive layer 901 is connected to the first connecting line 201 through a first source contact hole 351. The first gate contact hole 331 passes through a gate insulating layer 411 and a passivation layer 420. The first clock line CL1 is exposed through the first gate contact hole 331. The first source contact hole 351 passes through the passivation layer 420. The first connecting line 201 is exposed through the first source contact hole 351.

Although not illustrated, the first connecting line 201 includes at least one first curved portion.

The second clock line CL2, as illustrated in FIG. 2, is connected to the gate driver 266 through a second connecting line 202. In an exemplary embodiment, the second connecting line 202 connects the second clock line CL2 and the second stage ST2 of the gate driver 266, for example. The second clock line CL2 transmits the second clock signal CK2.

A compensation pattern 502 extends or protrudes from the second connecting line 202. Hereinafter, the compensation pattern 502 extending or protruding from the second connecting line 202 is defined as "second source compensation pattern 502." The second source compensation pattern 502, along with the second connecting line 202, may define a second hole 552. In other words, the second hole 552 is enclosed by the second source compensation pattern 502, having a U-shape, for example, and a linear portion of the second connecting line 202. However, the invention is not limited thereto, and the second source compensation pattern 502 may have various other shapes.

The second source compensation pattern 502 and the second connecting line 202 may be unitary with each other.

As illustrated in FIG. 4, the second clock line CL2 and the second connecting line 202 are disposed in different layers, respectively. The second clock line CL2 and the second connecting line 202 are connected to each other by a second conductive layer 902. A portion of the second conductive layer 902 is connected to the second clock line CL2 through a second gate contact hole 332, and another portion of the second conductive layer 902 is connected to the second connecting line 202 through a second source contact hole 352. The second gate contact hole 332 passes through the gate insulating layer 411 and the passivation layer 420. The second clock line CL2 is exposed through the second gate contact hole 332. The second source contact hole 352 passes through the passivation layer 420. The second connecting line 202 is exposed through the second source contact hole 352.

A planar area of the second source compensation pattern 502 is larger than a planar area of the first source compensation pattern of the first connecting line 201. In an exemplary embodiment, in the case that the first source compensation pattern has a planar area of 0, the second source compensation pattern 502 may have a planar area larger than that of the first source compensation pattern, for example.

The second connecting line 202 may include at least one second curved portion 702. A length of the second curved portion 702 is greater than that of the first curved portion of the first connecting line 201. In an exemplary embodiment, in the case that the length of the first curved portion is 0, the second curved portion 702 has a length greater than that of the first curved portion, for example.

The third clock line CL3, as illustrated in FIG. 2, is connected to the gate driver 266 through a third connecting line 203. In an exemplary embodiment, the third connecting line 203 connects the third clock line CL3 and the third stage ST3 of the gate driver 266. The third clock line CL3 transmits the third clock signal CK3.

A compensation pattern 503 extends or protrudes from the third connecting line 203. Hereinafter, the compensation pattern 503 extending or protruding from the third connecting line 203 is defined as "third source compensation pattern 503." The third source compensation pattern 503, along with the third connecting line 203, may define a third hole 553. In other words, the third hole 553 is enclosed by the third source compensation pattern 503, having a U-shape, for example, and a linear portion of the third connecting line 203. However, the invention is not limited thereto, and the third source compensation pattern 503 may have various other shapes.

The third source compensation pattern 503 and the third connecting line 203 may be unitary with each other.

The third clock line CL3 and the third connecting line 203 are disposed in different layers, respectively. The third clock line CL3 and the third connecting line 203 are connected to each other by a third conductive layer 903. A portion of the third conductive layer 903 is connected to the third clock line CL3 through a third gate contact hole 333, and another portion of the third conductive layer 903 is connected to the third connecting line 203 through a third source contact hole 353. The third gate contact hole 333 passes through the gate insulating layer 411 and the passivation layer 420. The third clock line CL3 is exposed through the third gate contact hole 333. The third source contact hole 353 passes through the passivation layer 420. The third connecting line 203 is exposed through the third source contact hole 353.

A planar area of the third source compensation pattern 503 is larger than the planar area of the second source compensation pattern 502.

The third connecting line 203 may include at least one third curved portion 703. A length of the third curved portion 703 is greater than that of the second curved portion 702.

The fourth clock line CL4, as illustrated in FIG. 2, is connected to the gate driver 266 through a fourth connecting line 204. In an exemplary embodiment, the fourth connecting line 204 connects the fourth clock line CL4 and the fourth stage ST4 of the gate driver 266, for example. The fourth clock line CL4 transmits the fourth clock signal CK4.

A compensation pattern 504 extends or protrudes from the fourth connecting line 204. Hereinafter, the compensation pattern 504 extending or protruding from the fourth connecting line 204 is defined as "fourth source compensation pattern 504." The fourth source compensation pattern 504, along with the fourth connecting line 204, may define a fourth hole 554. In other words, the fourth hole 554 is enclosed by the fourth source compensation pattern 504, having a U-shape, for example, and a linear portion of the fourth connecting line 204. However, the invention is not limited thereto, and the fourth source compensation pattern 504 may have various other shapes.

The fourth source compensation pattern 504 and the fourth connecting line 204 may be unitary with each other.

The fourth clock line CL4 and the fourth connecting line 204 are disposed in different layers, respectively. The fourth clock line CL4 and the fourth connecting line 204 are connected to each other by a fourth conductive layer 904. A portion of the fourth conductive layer 904 is connected to the fourth clock line CL4 through a fourth gate contact hole 334, and another portion of the fourth conductive layer 904 is connected to the fourth connecting line 204 through a fourth source contact hole 354. The fourth gate contact hole 334 passes through the gate insulating layer 411 and the passivation layer 420. The fourth clock line CL4 is exposed through the fourth gate contact hole 334. The fourth source contact hole 354 passes through the passivation layer 420. The fourth connecting line 204 is exposed through the fourth source contact hole 354.

A planar area of the fourth source compensation pattern 504 is larger than the planar area of the third source compensation pattern 503.

The fourth connecting line 204 may include at least one fourth curved portion 704. A length of the fourth curved portion 704 is greater than that of the third curved portion 703.

The fifth clock line CL5, as illustrated in FIG. 2, is connected to the gate driver 266 through a fifth connecting line 205. In an exemplary embodiment, the fifth connecting line 205 connects the fifth clock line CL5 and the fifth stage ST5 of the gate driver 266. The fifth clock line CL5 transmits the fifth clock signal CK5, for example.

A compensation pattern 505 extends or protrudes from the fifth connecting line 205. Hereinafter, the compensation pattern 505 extending or protruding from the fifth connecting line 205 is defined as "fifth source compensation pattern 505." The fifth source compensation pattern 505, along with the fifth connecting line 205, may define a fifth hole 555. In other words, the fifth hole 555 is enclosed by the fifth source compensation pattern 505, having a U-shape, for example, and a linear portion of the fifth connecting line 205. However, the invention is not limited thereto, and the fifth source compensation pattern 505 may have various other shapes.

The fifth source compensation pattern 505 and the fifth connecting line 205 may be unitary with each other.

The fifth clock line CL5 and the fifth connecting line 205 are disposed in different layers, respectively. The fifth clock line CL5 and the fifth connecting line 205 are connected to each other by a fifth conductive layer 905. A portion of the fifth conductive layer 905 is connected to the fifth clock line CL5 through a fifth gate contact hole 335, and another portion of the fifth conductive layer 905 is connected to the fifth connecting line 205 through a fifth source contact hole 355. The fifth gate contact hole 335 passes through the gate insulating layer 411 and the passivation layer 420. The fifth clock line CL5 is exposed through the fifth gate contact hole 335. The fifth source contact hole 355 passes through the passivation layer 420. The fifth connecting line 205 is exposed through the fifth source contact hole 355.

A planar area of the fifth source compensation pattern 505 is larger than the planar area of the fourth source compensation pattern 504.

The fifth connecting line 205 may include at least one fifth curved portion 705. A length of the fifth curved portion 705 is greater than that of the fourth curved portion 704.

The sixth clock line CL6, as illustrated in FIG. 2, is connected to the gate driver 266 through a sixth connecting line 206. In an exemplary embodiment, the sixth connecting line 206 connects the sixth clock line CL6 and the sixth stage ST6 of the gate driver 266, for example. The sixth clock line CL6 transmits the sixth clock signal CK6.

A compensation pattern 506 extends or protrudes from the sixth connecting line 206. Hereinafter, the compensation pattern 506 extending or protruding from the sixth connecting line 206 is defined as "sixth source compensation pattern 506." The sixth source compensation pattern 506, along with the sixth connecting line 206, may define a sixth hole 556. In other words, the sixth hole 556 is enclosed by the sixth source compensation pattern 506, having a U-shape, for example, and a linear portion of the sixth connecting line 206. However, the invention is not limited thereto, and the sixth source compensation pattern 506 may have various other shapes.

The sixth source compensation pattern 506 and the sixth connecting line 206 may be unitary with each other.

The sixth clock line CL6 and the sixth connecting line 206 are disposed in different layers, respectively. The sixth clock line CL6 and the sixth connecting line 206 are connected to each other by a sixth conductive layer 906. A portion of the sixth conductive layer 906 is connected to the sixth clock line CL6 through a sixth gate contact hole 336, and another portion of the sixth conductive layer 906 is connected to the sixth connecting line 206 through a sixth source contact hole 356. The sixth gate contact hole 336 passes through the gate insulating layer 411 and the passivation layer 420. The sixth clock line CL6 is exposed through the sixth gate contact hole 336. The sixth source contact hole 356 passes through the passivation layer 420. The sixth connecting line 206 is exposed through the sixth source contact hole 356.

A planar area of the sixth source compensation pattern 506 is larger than the planar area of the fifth source compensation pattern 505.

The sixth connecting line 206 may include at least one sixth curved portion 706. A length of the sixth curved portion 706 is greater than that of the fifth curved portion 705.

The seventh clock line CL7, as illustrated in FIG. 2, is connected to the gate driver 266 through a seventh connecting line 207. In an exemplary embodiment, the seventh connecting line 207 connects the seventh clock line CL7 and the seventh stage ST7 of the gate driver 266, for example. The seventh clock line CL7 transmits the seventh clock signal CK7.

A compensation pattern 507 extends or protrudes from the seventh connecting line 207. Hereinafter, the compensation pattern 507 extending or protruding from the seventh connecting line 207 is defined as "seventh source compensation pattern 507." The seventh source compensation pattern 507, along with the seventh connecting line 207, may define a seventh hole 557. In other words, the seventh hole 557 is enclosed by the seventh source compensation pattern 507, having a U-shape, for example, and a linear portion of the seventh connecting line 207. However, the invention is not limited thereto, and the seventh source compensation pattern 507 may have various other shapes.

The seventh source compensation pattern 507 and the seventh connecting line 207 may be unitary with each other.

The seventh clock line CL7 and the seventh connecting line 207 are disposed in different layers, respectively. The seventh clock line CL7 and the seventh connecting line 207 are connected to each other by a seventh conductive layer 907. A portion of the seventh conductive layer 907 is connected to the seventh clock line CL7 through a seventh gate contact hole 337, and another portion of the seventh conductive layer 907 is connected to the seventh connecting line 207 through a seventh source contact hole 357. The seventh gate contact hole 337 passes through the gate insulating layer 411 and the passivation layer 420. The seventh clock line CL7 is exposed through the seventh gate contact hole 337. The seventh source contact hole 357 passes through the passivation layer 420. The seventh connecting line 207 is exposed through the seventh source contact hole 357.

A planar area of the seventh source compensation pattern 507 is larger than the planar area of the sixth source compensation pattern 506.

The seventh connecting line 207 may include at least one seventh curved portion 707. A length of the seventh curved portion 707 is greater than that of the sixth curved portion 706.

The eighth clock line CL8, as illustrated in FIG. 2, is connected to the gate driver 266 through an eighth connecting line 208. In an exemplary embodiment, the eighth connecting line 208 connects the eighth clock line CL8 and the eighth stage ST8 of the gate driver 266, for example. The eighth clock line CL8 transmits the eighth clock signal CK8.

A compensation pattern 508 extends or protrudes from the eighth connecting line 208. Hereinafter, the compensation pattern 508 extending or protruding from the eighth connecting line 208 is defined as "eighth source compensation pattern 508." The eighth source compensation pattern 508, along with the eighth connecting line 208, may define an eighth hole 558. In other words, the eighth hole 558 is enclosed by the eighth source compensation pattern 508, having a U-shape, and a linear portion of the eighth connecting line 208. However, the invention is not limited thereto, and the eighth source compensation pattern 508 may have various other shapes.

The eighth source compensation pattern 508 and the eighth connecting line 208 may be unitary with each other.

The eighth clock line CL8 and the eighth connecting line 208 are disposed in different layers, respectively. The eighth clock line CL8 and the eighth connecting line 208 are connected to each other by an eighth conductive layer 908. A portion of the eighth conductive layer 908 is connected to the eighth clock line CL8 through an eighth gate contact hole 338, and another portion of the eighth conductive layer 908 is connected to the eighth connecting line 208 through an eighth source contact hole 358. The eighth gate contact hole 338 passes through the gate insulating layer 411 and the passivation layer 420. The eighth clock line CL8 is exposed through the eighth gate contact hole 338. The eighth source contact hole 358 passes through the passivation layer 420. The eighth connecting line 208 is exposed through the eighth source contact hole 358.

A planar area of the eighth source compensation pattern 508 is larger than the planar area of the seventh source compensation pattern 507. Accordingly, planar areas of the first, second, third, fourth, fifth, sixth, seventh, and eighth source compensation patterns 502, 503, 504, 505, 506, 507, and 508 have a relationship defined by the following Mathematical Inequation 1.

$$A1<A2<A3<A4<A5<A6<A7<A8 \quad \text{[Mathematical Inequation 1]}$$

In Mathematical Inequation 1, "A1" denotes the planar area of the first source compensation pattern, "A2" denotes the planar area of the second source compensation pattern 502, "A3" denotes the planar area of the third source compensation pattern 503, "A4" denotes the planar area of the fourth source compensation pattern 504, "A5" denotes the planar area of the fifth source compensation pattern 505, "A6" denotes the planar area of the sixth source compensation pattern 506, "A7" denotes the planar area of the seventh source compensation pattern 507, and "A8" denotes the planar area of the eighth source compensation pattern 508.

As described hereinabove, the first clock line CL1 is connected to the first source compensation pattern through the first connecting line 201, the second clock line CL2 is connected to the second source compensation pattern 502 through the second connecting line 202, the third clock line CL3 is connected to the third source compensation pattern 503 through the third connecting line 203, the fourth clock line CL4 is connected to the fourth source compensation pattern 504 through the fourth connecting line 204, the fifth clock line CL5 is connected to the fifth source compensation pattern 505 through the fifth connecting line 205, the sixth clock line CL6 is connected to the sixth source compensation pattern 506 through the sixth connecting line 206, the seventh clock line CL7 is connected to the seventh source compensation pattern 507 through the seventh connecting line 207, and the eighth clock line CL8 is connected to the eighth source compensation pattern 508 through the eighth connecting line 208. As such, as the clock line is closer to the gate driver 266, the clock line is connected to the source compensation pattern having a larger planar area electrically or indirectly.

The eighth connecting line 208 may include at least one eighth curved portion 708. A length of the eighth curved portion 708 is greater than that of the seventh curved portion 707. Accordingly, lengths of the first, second, third, fourth, fifth, sixth, seventh, and eighth curved portions 702, 703, 704, 705, 706, 707, and 708 have a relationship defined by the following Mathematical Inequation 2.

$$L1<L2<L3<L4<L5<L6<L7<L8 \quad \text{[Mathematical Inequation 2]}$$

In Mathematical Inequation 2, "L1" denotes the length of the first curved portion, "L2" denotes the length of the second curved portion 702, "L3" denotes the length of the third curved portion 703, "L4" denotes the length of the fourth curved portion 704, "L5" denotes the length of the fifth curved portion 705, "L6" denotes the length of the sixth curved portion 706, "L7" denotes the length of the seventh curved portion 707, and "L8" denotes the length of the eighth curved portion 708.

As described hereinabove, the first clock line CL1 is connected to the first curved portion through the first connecting line 201, the second clock line CL2 is connected to the second curved portion 702 through the second connecting line 202, the third clock line CL3 is connected to the third curved portion 703 through the third connecting line 203, the fourth clock line CL4 is connected to the fourth curved portion 704 through the fourth connecting line 204, the fifth clock line CL5 is connected to the fifth curved portion 705 through the fifth connecting line 205, the sixth clock line CL6 is connected to the sixth curved portion 706 through the sixth connecting line 206, the seventh clock line CL7 is connected to the seventh curved portion 707 through the seventh connecting line 207, and the eighth clock line CL8 is connected to the eighth curved portion 708 through the eighth connecting line 208. As such, as the clock line is closer to the gate driver 266, the clock line is electrically or indirectly connected to the curved portion having a longer length. Accordingly, the first, second, third, fourth, fifth, sixth, seventh, and eighth connecting lines 201, 202, 203, 204, 205, 206, 207, and 208 have the same length as one another by virtue of the first, second, third, fourth, fifth, sixth, seventh, and eighth curved portions 702, 703, 704, 705, 706, 707, and 708 that have different lengths from one another.

The eighth clock line CL8 is closest to the gate driver 266, among the first, second, third, fourth, fifth, sixth, seventh, and eighth clock lines CL1, CL2, CL3, CL4, CL5, CL6, CL7, and CL8. The first, second, third, fourth, fifth, sixth, seventh, and eighth source compensation patterns 502, 503, 504, 505, 506, 507, and 508 are disposed on the gate insulating layer 411 between the eighth clock line CL8 and the base line VSL. The first, second, third, fourth, fifth, sixth, seventh, and eighth source compensation patterns 502, 503, 504, 505, 506, 507, and 508 do not overlap any of the clock lines. In addition, the first, second, third, fourth, fifth, sixth, seventh, and eighth source compensation patterns 502, 503, 504, 505, 506, 507, and 508 do not overlap the base line VSL and the start line STL.

The base line VSL is connected to each of the stages ST1, ST2, ST3, ST4, ST5, ST6, ST7, and ST8 of the gate driver 266. The base line VSL transmits a base voltage. In an exemplary embodiment, the base voltage is a direct current ("DC") voltage, for example. Each of the stages ST1, ST2, ST3, ST4, ST5, ST6, ST7, and ST8 generates a low voltage of the gate signal, using the base voltage. The base line VSL is disposed on a same layer as that on which the first, second, third, fourth, fifth, sixth, seventh, and eighth clock lines CL1, CL2, CL3, CL4, CL5, CL6, CL7, and CL8 are disposed. The base line VSL is connected to each of the stages ST1, ST2, ST3, ST4, ST5, ST6, ST7, and ST8 through a contact hole 372, a connecting line 238, and a conductive layer 235.

The start line STL is connected to the first stage ST1 and the last stage described above. The start line STL is disposed on a same layer as that on which the first, second, third, fourth, fifth, sixth, seventh, and eighth clock lines CL1, CL2, CL3, CL4, CL5, CL6, CL7, and CL8 are disposed. The start line STL is connected to the first stage ST1 and the last stage through a contact hole 371, a connecting line 233, and the conductive layer 235.

As illustrated in FIGS. 4 and 5, the first, second, third, fourth, fifth, sixth, seventh, and eighth clock lines CL1, CL2, CL3, CL4, CL5, CL6, CL7, and CL8 are disposed on the first substrate 401 of the first panel 105. Although not illustrated, the first, second, third, fourth, fifth, sixth, seventh, and eighth connecting lines 201, 202, 203, 204, 205, 206, 207, and 208, the first, second, third, fourth, fifth, sixth, seventh, and eighth source compensation patterns 502, 503, 504, 505, 506, 507, and 508, the first, second, third, fourth, fifth, sixth, seventh, and eighth curved portions 702, 703, 704, 705, 706, 707, and 708, the base line VSL, and the start line STL are disposed on the first substrate 401. The first panel 105 includes the gate insulating layer 411 and the passivation layer 420, in addition to the first substrate 401.

The gate insulating layer 411 is disposed over the first, second, third, fourth, fifth, sixth, seventh, and eighth connecting lines 201, 202, 203, 204, 205, 206, 207, and 208, the first, second, third, fourth, fifth, sixth, seventh, and eighth source compensation patterns 502, 503, 504, 505, 506, 507, and 508, the first, second, third, fourth, fifth, sixth, seventh, and eighth curved portions 702, 703, 704, 705, 706, 707, and 708, the base line VSL, and the start line STL, and the passivation layer 420 is disposed on the gate insulating layer 411.

As illustrated in FIG. 4, the second panel 106 includes a second substrate 402, a light blocking layer 476, and a common electrode 430. The light blocking layer 476 is disposed on the second substrate 402, and the common electrode 430 is disposed on the light blocking layer 476. The common electrode 430 is disposed over an entire surface of the second substrate 402 including the light blocking layer 476. Accordingly, the first, second, third, fourth, fifth, sixth, seventh, and eighth clock lines CL1, CL2, CL3, CL4, CL5, CL6, CL7, and CL8, the first, second, third, fourth, fifth, sixth, seventh, and eighth connecting lines 201, 202, 203, 204, 205, 206, 207, and 208, the first, second, third, fourth, fifth, sixth, seventh, and eighth source compensation patterns 502, 503, 504, 505, 506, 507, and 508, the first, second, third, fourth, fifth, sixth, seventh, and eighth curved portions 702, 703, 704, 705, 706, 707, and 708, the base line VSL, the start line STL, and the gate driver 266 overlap the common electrode 430 of the second substrate 402.

As illustrated in FIGS. 4 and 5, a liquid crystal layer 433 is disposed between the first panel 105 and the second panel 106.

The first clock line CL1 and the first connecting line 201, the first source compensation pattern, and the first curved portion that are electrically connected to the first clock line CL1 are collectively defined as a first clock transmission unit. Likewise, the second clock line CL2 and the second connecting line 202, the second source compensation pattern 502, and the second curved portion 702 that are electrically connected to the second clock line CL2 are collectively defined as a second clock transmission unit. The third clock line CL3 and the third connecting line 203, the third source compensation pattern 503, and the third curved portion 703 that are electrically connected to the third clock line CL3 are collectively defined as a third clock transmission unit. The fourth clock line CL4 and the fourth connecting line 204, the fourth source compensation pattern 504, and the fourth curved portion 704 that are electrically connected to the fourth clock line CL4 are collectively defined as a fourth clock transmission unit. The fifth clock line CL5 and the fifth connecting line 205, the fifth source compensation pattern 505, and the fifth curved portion 705 that are electrically connected to the fifth clock line CL5 are collectively defined as a fifth clock transmission unit. The sixth clock line CL6 and the sixth connecting line 206, the sixth source compensation pattern 506, and the sixth curved portion 706 that are electrically connected to the sixth clock line CL6 are collectively defined as a sixth clock transmission unit. The seventh clock line CL7 and the seventh connecting line 207, the seventh source compensation pattern 507, and the seventh curved portion 707 that are electrically connected to the seventh clock line CL7 are collectively defined as a seventh clock transmission unit. The eighth clock line CL8 and the eighth connecting line 208, the eighth source compensation pattern 508, and the eighth curved portion 708 that are electrically connected to the eighth clock line CL8 are collectively defined as an eighth clock transmission unit.

Capacitors are provided between a respective clock transmission unit of the first, second, third, fourth, fifth, sixth, seventh, and eighth clock transmission units and the common electrode 430 which is opposite to the first, second, third, fourth, fifth, sixth, seventh, and eighth clock transmission units. In an exemplary embodiment, as illustrated in FIG. 4, a first capacitor C1 is provided between the first clock transmission unit and the common electrode 430, a second capacitor C2 is provided between the second clock transmission unit and the common electrode 430, a third capacitor C3 is provided between the third clock transmission unit and the common electrode 430, a fourth capacitor C4 is provided between the fourth clock transmission unit and the common electrode 430, a fifth capacitor C5 is provided between the fifth clock transmission unit and the common electrode 430, a sixth capacitor C6 is provided between the sixth clock transmission unit and the common electrode 430, a seventh capacitor C6 is provided between the seventh clock transmission unit and the common electrode 430, and an eighth capacitor C8 is provided between the eighth clock transmission unit and the common electrode 430, for example.

In the case that the first, second, third, fourth, fifth, sixth, seventh, and eighth source compensation patterns 502, 503, 504, 505, 506, 507, and 508 are absent, capacitances of the first, second, third, fourth, fifth, sixth, seventh, and eighth capacitors C1, C2, C3, C4, C5, C6, C7, and C8 may be changed, which will be described further in detail hereinbelow.

The second clock line CL2 of the second clock transmission unit overlaps another clock transmission unit, e.g., the first connecting line 201 of the first clock transmission unit. Accordingly, a portion of the second clock line CL2 except for a portion that is covered by the first connecting line 201 overlaps the common electrode 430. In other words, an overlapping area between the second clock line CL2 and the common electrode 430 may be reduced by the first connecting line 201.

In addition, the third clock line CL3 of the third clock transmission unit overlaps another clock transmission unit, e.g., the first connecting line 201 of the first clock transmission unit and the second connecting line 202 of the second clock transmission unit. Accordingly, a portion of the third clock line CL3 except for portions that are covered by the first and second connecting lines 201 and 202 overlaps the common electrode 430. In other words, an overlapping area between the third clock line CL3 and the common electrode 430 may be reduced by the first and second connecting lines 201 and 202.

In a manner described hereinabove, an overlapping area between the fourth clock line CL4 and the common electrode 430 is reduced by the first, second, and third connecting lines 201, 202, and 203, an overlapping area between the fifth clock line CL5 and the common electrode 430 is reduced by the first, second, third, and fourth connecting lines 201, 202, 203, and 204, an overlapping area between the sixth clock line CL6 and the common electrode 430 is reduced by the first, second, third, fourth, and fifth connecting lines 201, 202, 203, 204, and 205, an overlapping area between the seventh clock line CL7 and the common electrode 430 is reduced by the first, second, third, fourth, fifth, and sixth connecting lines 201, 202, 203, 204, 205, and 206, and an overlapping area between the eighth clock line CL8 and the common electrode 430 is reduced by the first, second, third, fourth, fifth, sixth, and seventh connecting lines 201, 202, 203, 204, 205, 206, and 207. In an exemplary embodiment, the first clock transmission unit is not covered by elements of other clock transmission units (e.g., second to eighth connecting lines of second to eighth clock transmission units), and thus an overlapping area between the first clock line CL1 and the common electrode 430 is not reduced.

Accordingly, the first clock line CL1, which is farthest from the gate driver 266 among the first, second, third, fourth, fifth, sixth, seventh, and eighth clock lines CL1, CL2, CL3, CL4, CL5, CL6, CL7, and CL8, overlaps the common electrode 430 by the largest area among areas of the first to eighth clock lines CL1 to CL8 overlapping the common electrode 430. The eighth clock line CL8, which is closest to the gate driver 266 among the first to eighth clock lines CL1 to CL8, overlaps the common electrode 430 by the smallest area among areas of the first to eighth clock lines CL1 to CL8 overlapping the common electrode 430. As such, as closer to the gate driver 266, a larger area of the clock line is covered by the connecting line of other clock transmission units. Accordingly, as closer to the gate driver 266, the clock line has a smaller overlapping area (i.e., an overlapping area between the clock line and the common electrode 430).

Accordingly, in the case that the first, second, third, fourth, fifth, sixth, seventh, and eighth source compensation patterns 502, 503, 504, 505, 506, 507, and 508 are absent, the first capacitor C1 between the common electrode 430 and the first clock transmission unit including the first clock line CL1 which is farthest from the gate driver 266 among the first, second, third, fourth, fifth, sixth, seventh, and eighth clock lines CL1, CL2, CL3, CL4, CL5, CL6, CL7, and CL8 has a greatest capacitance, and the eighth capacitor C8 between the common electrode 430 and the eighth clock transmission unit including the eighth clock line CL8 which is closest to the gate driver 266 among the first to eighth clock lines CL1 to CL8 has a smallest capacitance. In addition, the second capacitor C2 has a smaller capacitance than that of the first capacitor C1, the third capacitor C3 has a smaller capacitance than that of the second capacitor C2, The fourth capacitor C4 has a smaller capacitance than that of the third capacitor C3, the fifth capacitor C5 has a smaller capacitance than that of the fourth capacitor C4, the sixth capacitor C6 has a smaller capacitance than that of the fifth capacitor C5, and the seventh capacitor C7 has a smaller capacitance than that of the sixth capacitor C6.

In the case that the capacitances of the first, second, third, fourth, fifth, sixth, seventh, and eighth capacitors C1, C2, C3, C4, C5, C6, C7, and C8 vary, ripples of the common voltage applied to the common electrode 430 increases, which will be described further in detail hereinbelow.

When the clock signal is transitioned, the common voltage of the common electrode 430 varies in accordance with the transition tendency of the clock signal due to a coupling phenomenon with the clock signal. In the case that the clock signal is transitioned from a low voltage to a high voltage, the common voltage increases, and in the case that the clock signal is transitioned from a high voltage to a low voltage, the common voltage decreases, for example. However, as described hereinabove, the fifth, sixth, seventh and eighth clock signals CK5, CK6, CK7, and CK8 have the phases that are inverted, i.e., shifted by 180 degrees, with respect to the first, second, third, and fourth clock signals CK1, CK2, CK3, and CK4, respectively, and thus at a point in time when a voltage level of the first clock signal CK1 falls to a low voltage from a high voltage, for example, as described in FIG. 3, a voltage level of the fifth clock signal CK5 rises to a high voltage from a low voltage. In such a case, as the rise and fall of the clock signals cancel each other out, the common voltage may not experience variation. However, since the capacitance of the first capacitor C1 corresponding to the first clock signal CK1 is greater than the capacitance of the fifth capacitor C5 corresponding to the fifth clock signal CK5, as described hereinabove, the first clock signal CK1 may exert a greater influence to the common voltage than the fifth clock signal CK5 does thereto. Accordingly, at the transition point in time of the first clock signal CK1 and the fifth clock signal CK5, the common voltage may vary more toward a lower voltage level. When such variation is accumulated, the ripples of the common voltage may be significantly increased.

However, as illustrated in FIGS. 2 and 5, since the clock line is connected to the source compensation pattern that has a larger planar area as the clock line is closer to the gate driver 266, areas of the first, second, third, fourth, fifth, sixth, seventh, and eighth clock transmission units overlapping the common electrode 430 are substantially equal to one another. In such a case, the capacitances of respective capacitors of the first, second, third, fourth, fifth, sixth, seventh, and eighth capacitors C1, C2, C3, C4, C5, C6, C7, and C8 are substantially equal to one another, and accordingly, the clock signals that have inverted phases, e.g., the first clock signal CK1 and the fifth clock signal CK5, may exert substantially the same degree of an influence to the common voltage. Accordingly, the ripples of the common voltage may be significantly reduced (i.e., minimized).

In addition, the first, second, third, fourth, fifth, sixth, seventh, and eighth source compensation patterns 502, 503, 504, 505, 506, 507, and 508 are connected to corresponding ones of the connecting lines, respectively, as a short circuit or as an open circuit. In such an exemplary embodiment, current is not applied to the first, second, third, fourth, fifth, sixth, seventh, and eighth source compensation patterns 502, 503, 504, 505, 506, 507, and 508. Accordingly, the first, second, third, fourth, fifth, sixth, seventh, and eighth source compensation patterns 502, 503, 504, 505, 506, 507, and 508 do not change resistance of the corresponding ones of the connecting lines.

FIGS. 6A to 6D are views illustrating various shapes of a source compensation pattern 500.

Figure 6A:
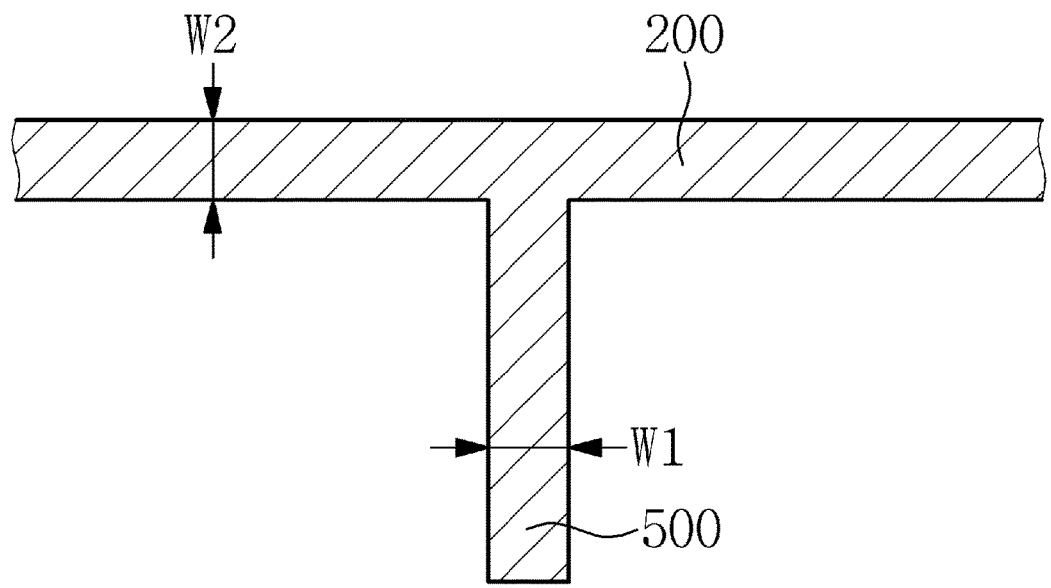
FIGS. 6A, 6B, 6C, and 6D are views illustrating various shapes of a source compensation pattern.

In an exemplary embodiment, the source compensation pattern 500, as illustrated in FIG. 6A, may have a linear shape, for example. In such an exemplary embodiment, a line width W1 of the source compensation pattern 500 may be the same as a line width W2 of a connecting line 200. The first, second, third, fourth, fifth, sixth, seventh, and eighth source compensation patterns 502, 503, 504, 505, 506, 507, and 508 described hereinabove may each have a shape illustrated in FIG. 6A. However, in such an exemplary embodiment, the first, second, third, fourth, fifth, sixth, seventh, and eighth source compensation patterns 502, 503, 504, 505, 506, 507, and 508 respectively have different planar areas, as described hereinabove.

Figure 6B:
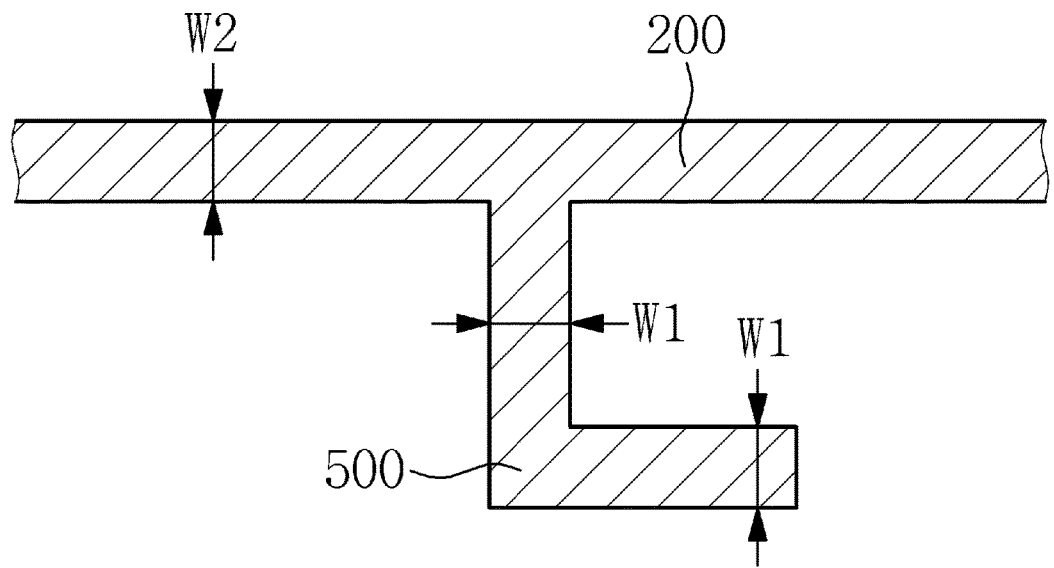

In an exemplary embodiment, the source compensation pattern 500, as illustrated in FIG. 6B, may have an L-like shape, for example. In such an exemplary embodiment, a line width W1 of the source compensation pattern 500 may be the same as a line width W2 of the connecting line 200. The first, second, third, fourth, fifth, sixth, seventh, and eighth source compensation patterns 502, 503, 504, 505, 506, 507, and 508 described hereinabove may each have a shape illustrated in FIG. 6B. However, in such an exemplary embodiment, the first, second, third, fourth, fifth, sixth, seventh, and eighth source compensation patterns 502, 503, 504, 505, 506, 507, and 508 respectively have different planar areas, as described hereinabove.

Figure 6C:
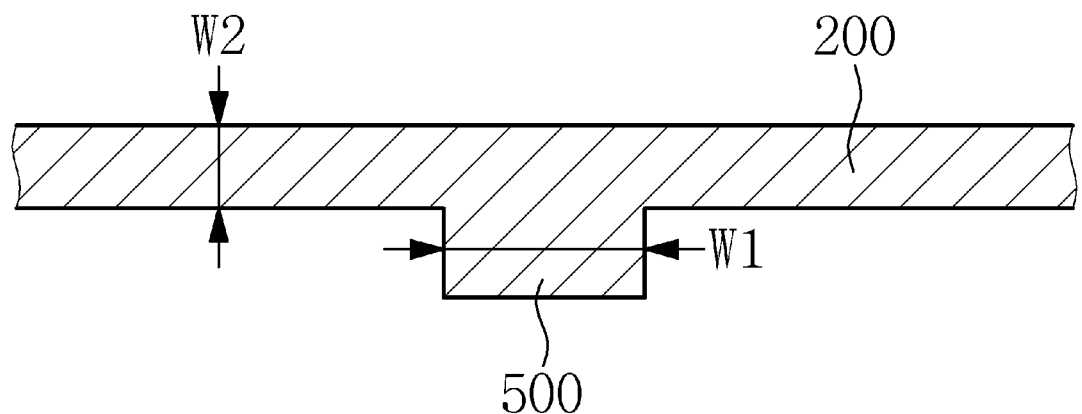

In an exemplary embodiment, the source compensation pattern 500, as illustrated in FIG. 6C, may have a linear shape, for example. In such an exemplary embodiment, a line width W1 of the source compensation pattern 500 may be greater than a line width W2 of the connecting line 200. The first, second, third, fourth, fifth, sixth, seventh, and eighth source compensation patterns 502, 503, 504, 505, 506, 507, and 508 described hereinabove may each have a shape illustrated in FIG. 6C.

However, in such an exemplary embodiment, the first, second, third, fourth, fifth, sixth, seventh, and eighth source compensation patterns 502, 503, 504, 505, 506, 507, and 508 respectively have different planar areas, as described hereinabove.

Figure 6D:
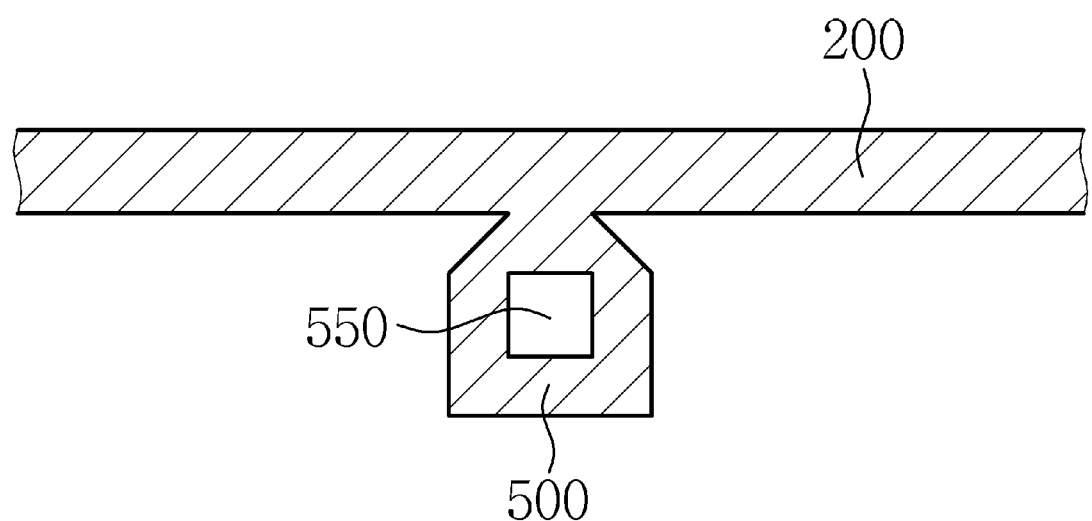

In an exemplary embodiment, a hole 550 may be defined in the source compensation pattern 500, as illustrated in FIG. 6D. In other words, the source compensation pattern 500 defines the hole 550. The first, second, third, fourth, fifth, sixth, seventh, and eighth source compensation patterns 502, 503, 504, 505, 506, 507, and 508 described hereinabove may each have a shape illustrated in FIG. 6D. However, in such an exemplary embodiment, the first, second, third, fourth, fifth, sixth, seventh, and eighth source compensation patterns 502, 503, 504, 505, 506, 507, and 508 respectively have different planar areas, as described hereinabove.

Figure 7A:
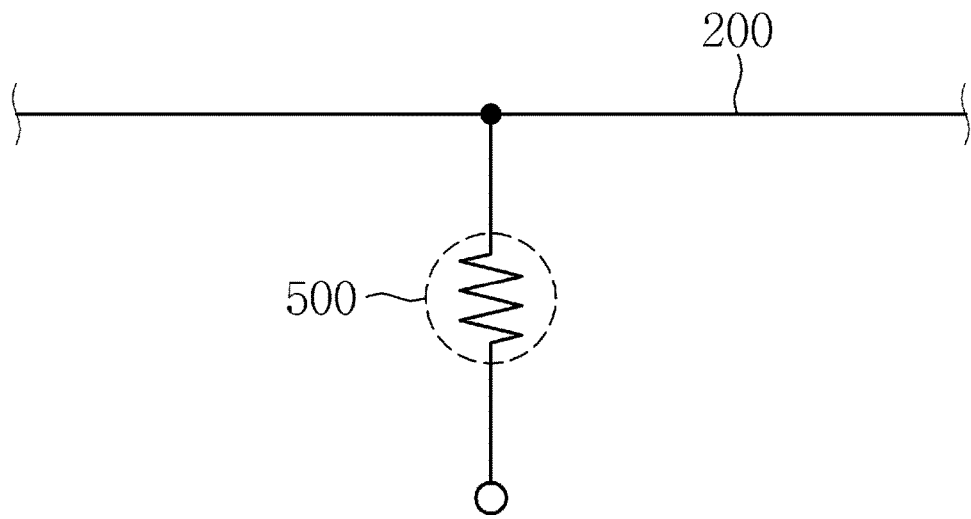
FIGS. 7A and 7B are equivalent circuit diagrams of the source compensation pattern illustrated in FIGS. 6A, 6B, 6C, and 6D.
Figure 7B:
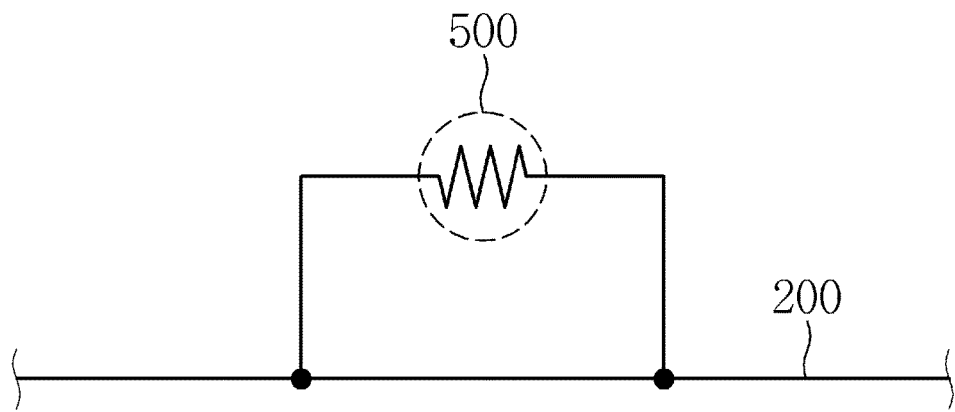

FIGS. 7A and 7B are equivalent circuit diagrams of the source compensation pattern 500 illustrated in FIGS. 6A, 6B, 6C, and 6D.

Referring to FIG. 7A, the source compensation pattern 500 illustrated in FIGS. 6A, 6B, and 6C may be represented by a resistor including a first terminal which is connected to the connecting line 200 and a second terminal which is open-circuited. Accordingly, a current substantially does not flow through the resistor.

Referring to FIG. 7B, the source compensation pattern 500 illustrated in FIG. 6D may be represented by a resistor which is short-circuited by the connecting line 200. Accordingly, a current substantially does not flow through the resistor.

Figure 8:
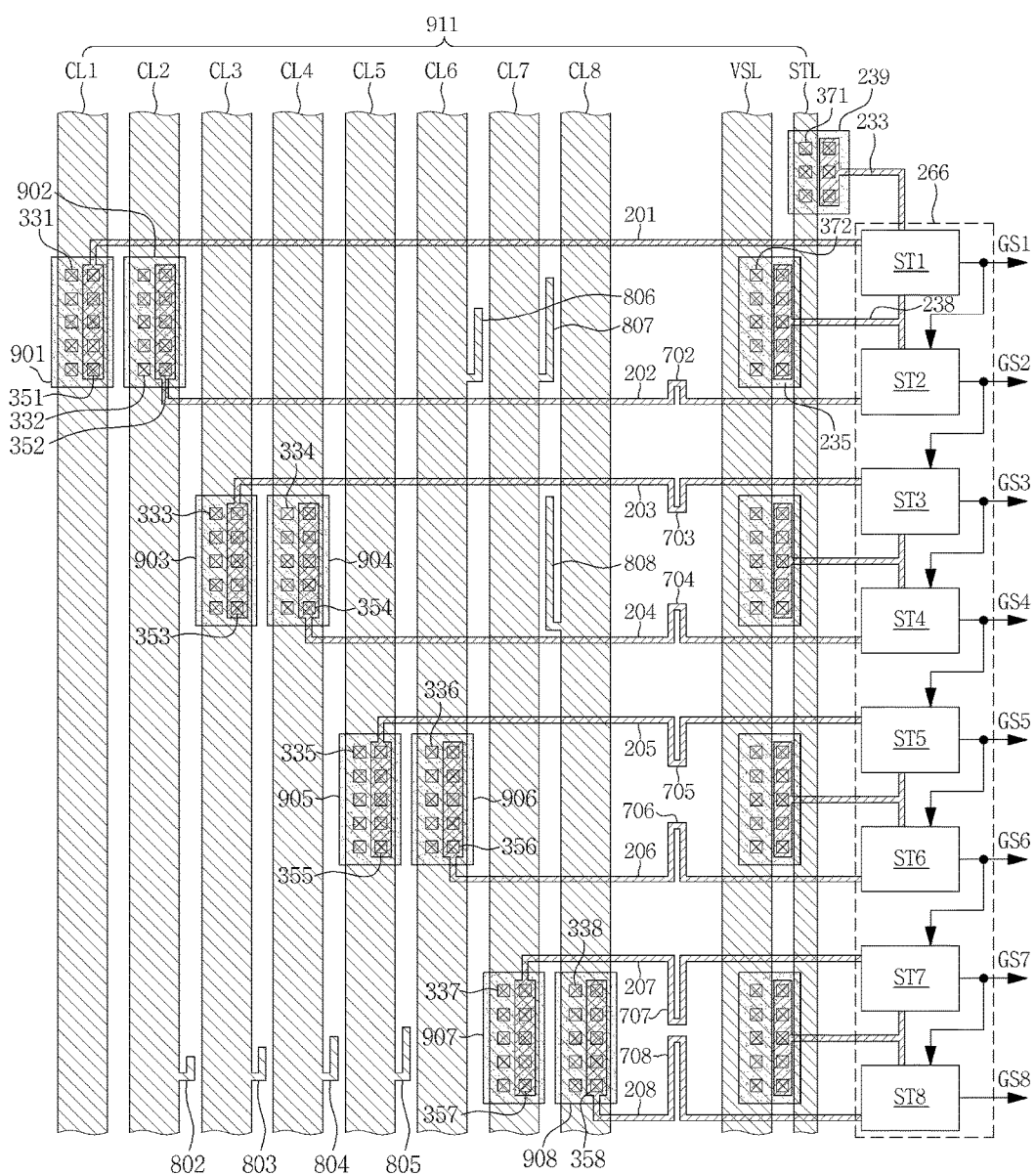
FIG. 8 is a view illustrating an alternative exemplary embodiment of a connecting relationship between the gate control line and the gate driver of FIG. 1.

FIG. 8 is a view illustrating an alternative exemplary embodiment of a connecting relationship between the gate control line 911 and the gate driver 266 of FIG. 1. A portion of the gate control line 911 and a portion of the gate driver 266 are illustrated in FIG. 8.

First, second, third, fourth, fifth, sixth, seventh, and eighth clock lines CL1, CL2, CL3, CL4, CL5, CL6, CL7, and CL8, first, second, third, fourth, fifth, sixth, seventh, and eighth connecting lines 201, 202, 203, 204, 205, 206, 207, and 208, first, second, third, fourth, fifth, sixth, seventh, and eighth conductive layers 901, 902, 903, 904, 905, 906, 907, and 908, first, second, third, fourth, fifth, sixth, seventh, and eighth gate contact holes 331, 332, 333, 334, 335, 336, 337, and 338, first, second, third, fourth, fifth, sixth, seventh, and eighth source contact holes 351, 352, 353, 354, 355, 356, 357, and 358, first, second, third, fourth, fifth, sixth, seventh, and eighth curved portions 702, 703, 704, 705, 706, 707, and 708, a base line VSL, a start line STL, contact holes 371 and 372, connecting lines 238 and 239, and stages ST1, ST2, ST3, ST4, ST5, ST6, ST7, and ST8 illustrated in FIG. 8 are the same as the corresponding elements illustrated in FIG. 2, and thus descriptions pertaining thereto will make reference to FIG. 2 and the related descriptions.

Although not illustrated, a compensation pattern may extend or protrude from the first clock line CL1. Hereinafter, the compensation pattern extending or protruding from the first clock line CL1 will be defined as "first gate compensation pattern." In an exemplary embodiment, the first gate compensation pattern may have an L-like shape, for example. However, the invention is not limited thereto, and the first gate compensation pattern may have various other shapes.

The first gate compensation pattern and the first clock line CL1 may be unitary with each other.

The first gate compensation pattern does not overlap each of the first, second, third, fourth, fifth, sixth, seventh, and eighth connecting lines 201, 202, 203, 204, 205, 206, 207, and 208 and each of the first, second, third, fourth, fifth, sixth, seventh, and eighth curved portions 702, 703, 704, 705, 706, 707, and 708.

A compensation pattern 802 extends or protrudes from the second clock line CL2. Hereinafter, the compensation pattern 802 extending or protruding from the second clock line CL2 will be defined as "second gate compensation pattern 802." In an exemplary embodiment, the second gate compensation pattern 802 may have an L-like shape, for example. However, the invention is not limited thereto, and the second gate compensation pattern 802 may have various other shapes.

The second gate compensation pattern 802 and the second clock line CL2 may be unitary with each other.

The second gate compensation pattern 802 does not overlap each of the first, second, third, fourth, fifth, sixth, seventh, and eighth connecting lines 201, 202, 203, 204, 205, 206, 207, and 208 and each of the first, second, third, fourth, fifth, sixth, seventh, and eighth curved portions 702, 703, 704, 705, 706, 707, and 708.

A planar area of the second gate compensation pattern 802 is larger than a planar area of the first gate compensation pattern. In an exemplary embodiment, in the case that the first gate compensation pattern has a planar area of 0, the second gate compensation pattern 802 may have a planar area larger than that of the first source compensation pattern, for example.

A compensation pattern 803 extends or protrudes from the third clock line CL3. Hereinafter, the compensation pattern 803 extending or protruding from the third clock line CL3 will be defined as "third gate compensation pattern 803." In an exemplary embodiment, the third gate compensation pattern 803 may have an L-like shape, for example. However, the invention is not limited thereto, and the third gate compensation pattern 803 may have various other shapes.

The third gate compensation pattern 803 and the third clock line CL3 may be unitary with each other.

The third gate compensation pattern 803 does not overlap each of the first, third, third, fourth, fifth, sixth, seventh, and eighth connecting lines 201, 202, 203, 204, 205, 206, 207, and 208 and each of the first, third, third, fourth, fifth, sixth, seventh, and eighth curved portions 702, 703, 704, 705, 706, 707, and 708.

A planar area of the third gate compensation pattern 803 is larger than the planar area of the second gate compensation pattern 802.

A compensation pattern 804 extends or protrudes from the fourth clock line CL4. Hereinafter, the compensation pattern 804 extending or protruding from the fourth clock line CL4 will be defined as "fourth gate compensation pattern 804." In an exemplary embodiment, the fourth gate compensation pattern 804 may have an L-like shape, for example. However, the invention is not limited thereto, and the fourth gate compensation pattern 804 may have various other shapes.

The fourth gate compensation pattern 804 and the fourth clock line CL4 may be unitary with each other.

The fourth gate compensation pattern 804 does not overlap each of the first, fourth, fourth, fourth, fifth, sixth, seventh, and eighth connecting lines 201, 202, 203, 204, 205, 206, 207, and 208 and each of the first, fourth, fourth, fourth, fifth, sixth, seventh, and eighth curved portions 702, 703, 704, 705, 706, 707, and 708.

A planar area of the fourth gate compensation pattern 804 is larger than the planar area of the third gate compensation pattern 803.

A compensation pattern 805 extends or protrudes from the fifth clock line CL5. Hereinafter, the compensation pattern 805 extending or protruding from the fifth clock line CL5 will be defined as "fifth gate compensation pattern 805." In an exemplary embodiment, the fifth gate compensation pattern 805 may have an L-like shape, for example. However, the invention is not limited thereto, and the fifth gate compensation pattern 805 may have various other shapes.

The fifth gate compensation pattern 805 and the fifth clock line CL5 may be unitary with each other.

The fifth gate compensation pattern 805 does not overlap each of the first, fifth, fifth, fifth, fifth, sixth, seventh, and eighth connecting lines 201, 202, 203, 204, 205, 206, 207, and 208 and each of the first, fifth, fifth, fifth, fifth, sixth, seventh, and eighth curved portions 702, 703, 704, 705, 706, 707, and 708.

A planar area of the fifth gate compensation pattern 805 is larger than the planar area of the fourth gate compensation pattern 804.

A compensation pattern 806 extends or protrudes from the sixth clock line CL6. Hereinafter, the compensation pattern 806 extending or protruding from the sixth clock line CL6 will be defined as "sixth gate compensation pattern 806." In an exemplary embodiment, the sixth gate compensation pattern 806 may have an L-like shape, for example. However, the invention is not limited thereto, and the sixth gate compensation pattern 806 may have various other shapes.

The sixth gate compensation pattern 806 and the sixth clock line CL6 may be unitary with each other.

The sixth gate compensation pattern 806 does not overlap each of the first, sixth, sixth, sixth, sixth, sixth, seventh, and eighth connecting lines 201, 202, 203, 204, 205, 206, 207, and 208 and each of the first, sixth, sixth, sixth, sixth, sixth, seventh, and eighth curved portions 702, 703, 704, 705, 706, 707, and 708.

A planar area of the sixth gate compensation pattern 806 is larger than the planar area of the fifth gate compensation pattern 805.

A compensation pattern 807 extends or protrudes from the seventh clock line CL7. Hereinafter, the compensation pattern 807 extending or protruding from the seventh clock line CL7 will be defined as "seventh gate compensation pattern 807." In an exemplary embodiment, the seventh gate compensation pattern 807 may have an L-like shape, for example. However, the invention is not limited thereto, and the seventh gate compensation pattern 807 may have various other shapes.

The seventh gate compensation pattern 807 and the seventh clock line CL7 may be unitary with each other.

The seventh gate compensation pattern 807 does not overlap each of the first, seventh, seventh, seventh, seventh, seventh, seventh, and eighth connecting lines 201, 202, 203, 204, 205, 206, 207, and 208 and each of the first, seventh, seventh, seventh, seventh, seventh, seventh, and eighth curved portions 702, 703, 704, 705, 706, 707, and 708.

A planar area of the seventh gate compensation pattern 807 is larger than the planar area of the sixth gate compensation pattern 806.

A compensation pattern 808 extends or protrudes from the eighth clock line CL8. Hereinafter, the compensation pattern 808 extending or protruding from the eighth clock line CL8 will be defined as "eighth gate compensation pattern 808." In an exemplary embodiment, the eighth gate compensation pattern 808 may have an L-like shape, for example. However, the invention is not limited thereto, and the eighth gate compensation pattern 808 may have various other shapes.

The eighth gate compensation pattern 808 and the eighth clock line CL8 may be unitary with each other.

The eighth gate compensation pattern 808 does not overlap each of the first, eighth, eighth, eighth, eighth, eighth, eighth, and eighth connecting lines 201, 202, 203, 204, 205, 206, 207, and 208 and each of the first, eighth, eighth, eighth, eighth, eighth, eighth, and eighth curved portions 702, 703, 704, 705, 706, 707, and 708.

A planar area of the eighth gate compensation pattern 808 is larger than the planar area of the seventh source compensation pattern 507. Accordingly, planar areas of respective gate compensation patterns of the first, second, third, fourth, fifth, sixth, seventh, and eighth gate compensation patterns 802, 803, 804, 805, 806, 807, and 808 have a relationship defined by the following Mathematical Inequation 3.

$$A1'<A2'<A3'<A4'<A5'<A6'<A7'<A8'$$ [Mathematical Inequation 3]

In Mathematical Inequation 3, A1' denotes a planar area of the first gate compensation pattern, A2' denotes a planar area of the second gate compensation pattern 802, A3' denotes a planar area of the third gate compensation pattern 803, A4' denotes a planar area of the fourth gate compensation pattern 804, A5' denotes a planar area of the fifth gate compensation pattern 805, A6' denotes a planar area of the sixth gate compensation pattern 806, A7' denotes a planar area of the seventh gate compensation pattern 807, and A8' denotes a planar area of the eighth gate compensation pattern 808.

As described above, the first clock line CL1 is connected to the first gate compensation pattern, the second clock line CL2 is connected to the second gate compensation pattern 802, the third clock line CL3 is connected to the third gate compensation pattern 803, the fourth clock line CL4 is connected to the fourth gate compensation pattern 804, the fifth clock line CL5 is connected to the fifth gate compensation pattern 805, the sixth clock line CL6 is connected to the sixth gate compensation pattern 806, the seventh clock line CL7 is connected to the seventh gate compensation pattern 807, and the eighth clock line CL8 is connected to the eighth gate compensation pattern 808. As such, as the clock line is closer to the gate driver 266, the clock line is electrically or indirectly connected to the gate compensation pattern that has a larger planar area. Accordingly, areas of the first, second, third, fourth, fifth, sixth, seventh, and eighth clock transmission units overlapping the common electrode 430 are substantially equal to one another. Accordingly, ripples of the aforementioned common voltage may be significantly reduced (i.e., minimized).

The first, second, third, fourth, fifth, sixth, seventh, and eighth gate compensation patterns 802, 803, 804, 805, 806, 807, and 808 may each have the same shape as the shape of the source compensation pattern 500 illustrated in FIG. 2. In other words, the gate compensation pattern, along with the clock line connected to the gate compensation pattern, may define a hole.

In addition, the first, second, third, fourth, fifth, sixth, seventh, and eighth gate compensation patterns 802, 803, 804, 805, 806, 807, and 808 may each have the same shape as the shape of the source compensation pattern 500 illustrated in one of FIGS. 6A, 6C, and 6D. In other words, the gate compensation pattern, as the source compensation pattern 500 illustrated in FIG. 6A or 6C, may have a linear shape, for example. In such an exemplary embodiment, a line width of the gate compensation pattern may be greater than or equal to a line width of the clock line. In an alternative exemplary embodiment, a hole may be defined in the gate compensation pattern, as illustrated in the source compensation pattern 500 illustrated in FIG. 6D.

Figure 9:
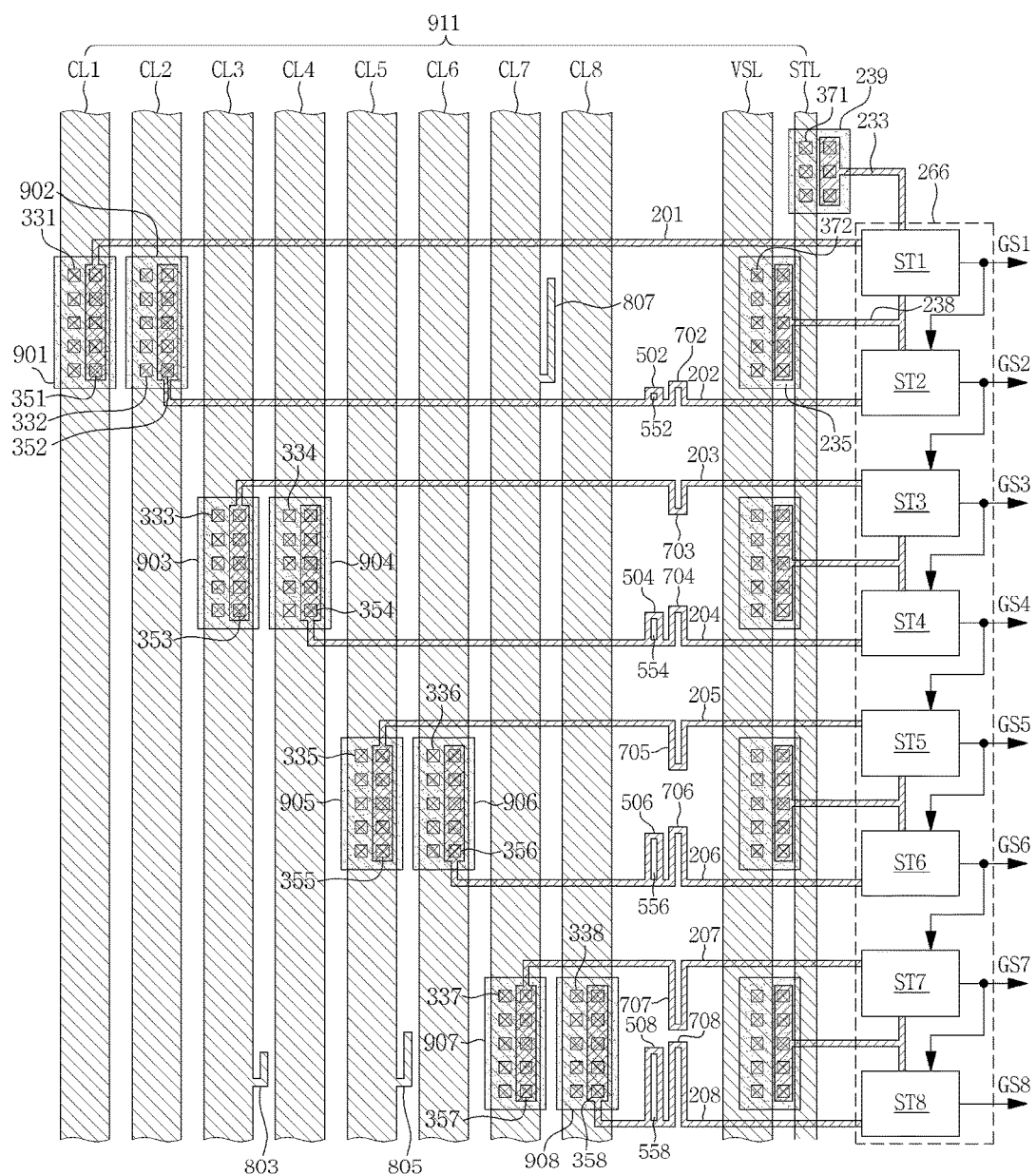
FIG. 9 is a view illustrating another alternative exemplary embodiment of a connecting relationship between the gate control line and the gate driver of FIG. 1.

FIG. 9 is a view illustrating another alternative exemplary embodiment of a connecting relationship between the gate control line 911 and the gate driver 266 of FIG. 1. A portion of the gate control line 911 and a portion of the gate driver 266 are illustrated in FIG. 9.

First, second, third, fourth, fifth, sixth, seventh, and eighth clock lines CL1, CL2, CL3, CL4, CL5, CL6, CL7, and CL8, first, second, third, fourth, fifth, sixth, seventh, and eighth connecting lines 201, 202, 203, 204, 205, 206, 207, and 208, first, second, third, fourth, fifth, sixth, seventh, and eighth conductive layers 901, 902, 903, 904, 905, 906, 907, and 908, first, second, third, fourth, fifth, sixth, seventh, and eighth gate contact holes 331, 332, 333, 334, 335, 336, 337, and 338, first, second, third, fourth, fifth, sixth, seventh, and eighth source contact holes 351, 352, 353, 354, 355, 356, 357, and 358, first, second, third, fourth, fifth, sixth, seventh, and eighth curved portions 702, 703, 704, 705, 706, 707, and 708, a base line VSL, a start line STL, contact holes 371 and 372, connecting lines 238 and 239, and stages ST1, ST2, ST3, ST4, ST5, ST6, ST7, and ST8 illustrated in FIG. 8 are the same as the corresponding elements illustrated in FIG. 2, and thus descriptions pertaining thereto will make reference to FIG. 2 and the related descriptions.

In addition, second, fourth, sixth, and eighth source compensation patterns 502, 504, 506, and 508 illustrated in FIG. 9 are the same as the corresponding elements of FIG. 2, and first, third, fifth, and seventh gate compensation patterns 803, 805, and 807 are the same as the corresponding elements of FIG. 8, and thus descriptions pertaining thereto will make reference to FIGS. 2 and 8 and the related descriptions.

A display device illustrated in FIG. 9 includes both of the source compensation pattern and the gate compensation pattern described hereinabove.

The source compensation pattern and the gate compensation pattern may be connected to different clock lines, respectively. In such an exemplary embodiment, the source compensation pattern may be connected to an even-numbered clock line through a connecting line, and the gate compensation pattern may be connected to an odd-numbered clock line. In an exemplary embodiment, as illustrated in FIG. 9, the second clock line CL2 may be connected to the second source compensation pattern 502 through the second connecting line 202, the third clock line CL3 may be connected to the third gate compensation pattern 803, the fourth clock line CL4 may be connected to the fourth source compensation pattern 504 through the fourth connecting line 204, the fifth clock line CL5 may be connected to the fifth gate compensation pattern 805, the sixth clock line CL6 may be connected to the sixth source compensation pattern 506 through the sixth connecting line 206, the seventh clock line CL7 may be connected to the seventh gate compensation pattern 807, and the eighth clock line CL8 may be connected to the eighth source compensation pattern 508 through the eighth connecting line 208, for example.

A planar area of the third gate compensation pattern 803 is larger than a planar area of the second source compensation pattern 502, a planar area of the fourth source compensation pattern 504 is larger than the planar area of the third gate compensation pattern 803, a planar area of the fifth gate compensation pattern 805 is larger than the planar area of the fourth source compensation pattern 504, a planar area of the sixth source compensation pattern 506 is larger than the planar area of the fifth gate compensation pattern 805, a planar area of the seventh gate compensation pattern 807 is larger than the planar area of the sixth source compensation pattern 506, and a planar area of the eighth source compensation pattern 508 is larger than the planar area of the seventh gate compensation pattern 807.

As such, by virtue of the source compensation patterns and the gate compensation patterns having difference planar areas, areas of the first, second, third, fourth, fifth, sixth, seventh, and eighth clock transmission units overlapping the common electrode 430 are substantially equal to one another. Accordingly, ripples of the aforementioned common voltage may be significantly reduced (i.e., minimized).

Although not illustrated, the first clock line CL1 may be connected to the first gate compensation pattern. The first gate compensation pattern may have a planar area of 0 or a planar area smaller than that of the second source compensation pattern 502.

In an alternative exemplary embodiment, the source compensation pattern may be connected to an odd-numbered clock line through a connecting line, and the gate compensation pattern may be connected to an even-numbered clock line.

The second, fourth, sixth, and eighth source compensation patterns 502, 504, 506, and 508 illustrated in FIG. 9 may each have a shape substantially the same as the shape of the source compensation pattern 500 illustrated in one of FIGS. 6A, 6B, 6C, and 6D. In addition, the first, third, fifth, and seventh gate compensation patterns 803, 805, and 807 may each have a shape substantially the same as the shape of the source compensation pattern 500 illustrated in FIGS. 6A, 6C, and 6D.

Figure 10:
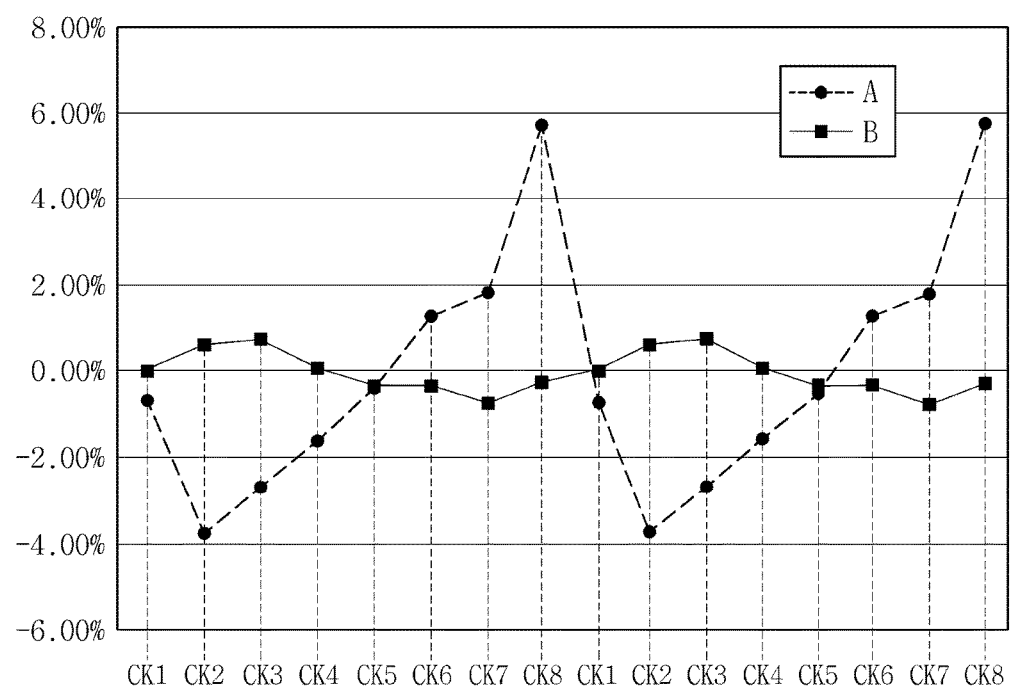
FIG. 10 is a view illustrating a resistance-capacitance ("RC") deviation of clock transmission units.

FIG. 10 is a view illustrating a resistance-capacitance ("RC") deviation of clock transmission units.

In FIG. 10, an x-axis represents first, second, third, fourth, fifth, sixth, seventh, and eighth clock signals CK1, CK2, CK3, CK4, CK5, CK6, CK7, and CK8, and a y-axis represents RC deviations of respective clock transmission units of the first, second, third, fourth, fifth, sixth, seventh, and eighth clock transmission units which receive the first, second, third, fourth, fifth, sixth, seventh, and eighth clock signals CK1, CK2, CK3, CK4, CK5, CK6, CK7, and CK8. As used herein, the RC deviation is obtained by dividing an RC value of each of the clock transmission units by an average RC value of the entirety of the clock transmission units.

A curve A which is represented by a dotted line denotes RC deviations of respective clock transmission units of the first, second, third, fourth, fifth, sixth, seventh, and eighth clock transmission units provided in a conventional display device, and a curve B which is represented by a solid line denotes RC deviations of respective clock transmission units of the first, second, third, fourth, fifth, sixth, seventh, and eighth clock transmission units provided in an exemplary embodiment of a display device.

Referring to FIG. 10, it is verified that the RC deviation of the first, second, third, fourth, fifth, sixth, seventh, and eighth clock transmission units corresponding to the curve B is smaller than the RC deviation of the first, second, third, fourth, fifth, sixth, seventh, and eighth clock transmission units corresponding to the curve A. A variation degree of the RC deviation of the clock transmission units corresponding to the curve B is less than about 2 percent (%). As such, as the clock transmission units in an exemplary embodiment of a display device achieves a small RC deviation, ripples of the common voltage may be significantly reduced (i.e., minimized).

As set forth above, according to one or more exemplary embodiments, areas of respective clock lines overlapping the common electrode are substantially equal to one another by virtue of the compensation pattern. Accordingly, the clock signals having phases opposite to each other may exert substantially the same influence to the common voltage. Therefore, ripples of the common voltage may be significantly reduced.

From the foregoing, it will be appreciated that various embodiments in accordance with the invention have been described herein for purposes of illustration, and that various modifications may be made without departing from the scope and spirit of the teachings. Accordingly, the various embodiments disclosed herein are not intended to be limiting of the true scope and spirit of the teachings. Various features of the above described and other embodiments can be mixed and matched in any manner, to produce further embodiments consistent with the invention.

What is claimed is:

1. A display device comprising:
 a first substrate and a second substrate opposite to each other;
 a gate line on the first substrate;
 a gate driver which is connected to the gate line;
 a clock line which transmits a clock signal;
 a connecting line which connects the clock line and the gate driver;
 a common electrode on the second substrate, the common electrode overlapping the clock line and the connecting line; and
 a compensation pattern which overlaps the common electrode and extends from the connecting line.

2. A display device comprising:
 a first substrate and a second substrate opposite to each other;
 a gate line on the first substrate;
 a gate driver which is connected to the gate line;
 a clock line which transmits a clock signal;
 a connecting line which connects the clock line and the gate driver;
 a common electrode on the second substrate, the common electrode overlapping the clock line and the connecting line; and
 a compensation pattern which overlaps the common electrode and extends from the connecting line;
 wherein the clock line, the connecting line, and the compensation pattern respectively comprise a plurality of clock lines, a plurality of connecting lines, and a plurality of compensation patterns which are connected to one another, respectively, in one-to-one correspondence; and
 the plurality of compensation patterns corresponding to respective connecting lines of the plurality of connecting lines have different planar areas from one another.

3. The display device as claimed in claim 2, wherein the clock line is electrically connected to a compensation pattern which has a larger planar area, as the clock line is closer to the gate driver.

4. The display device as claimed in claim 2, further comprising a base line between the gate driver and a clock line which is closest to the gate driver, the base line connected to the gate driver, wherein the compensation pattern is on an insulating layer between the clock line which is closest to the gate driver and the base line.

5. The display device as claimed in claim 4, wherein the compensation pattern does not overlap the clock line and the base line.

6. The display device as claimed in claim 2, wherein at least one hole is defined by the connecting line and the compensation pattern.

7. The display device as claimed in claim 2, wherein at least one hole is defined by the compensation pattern.

8. The display device as claimed in claim 2, wherein the compensation pattern has one of a linear shape and an L-like shape.

9. The display device as claimed in claim 2, wherein the compensation pattern has a line width greater than or equal to a line width of the connecting line.

10. The display device as claimed in claim 2, wherein the compensation pattern is on a same layer as that on which the connecting line is disposed.

11. The display device as claimed in claim 2, wherein the plurality of connecting lines have curved portions, respectively.

12. The display device as claimed in claim 11, wherein the clock line is connected to a curved portion which has a longer length, as the clock line is closer to the gate driver.

13. The display device as claimed in claim 11, wherein the plurality of connecting lines have substantially the same resistance with each other.

14. The display device as claimed in claim 2, wherein the clock line overlaps a greater number of connecting lines of the plurality of connecting lines, as the clock line is closer to the gate driver.

15. A display device comprising:
a first substrate and a second substrate opposite to each other;
a gate line on the first substrate;
a gate driver which is connected to the gate line;
a clock line which transmits a clock signal;
a connecting line which connects the clock line and the gate driver;
a common electrode on the second substrate, the common electrode overlapping the clock line and the connecting line; and
a compensation pattern which overlaps the common electrode and extends from the clock line.

16. A display device comprising:
a first substrate and a second substrate opposite to each other;
a gate line on the first substrate;
a gate driver which is connected to the gate line;
a clock line which transmits a clock signal;
a connecting line which connects the clock line and the gate driver;
a common electrode on the second substrate, the common electrode overlapping the clock line and the connecting line; and
a compensation pattern which overlaps the common electrode and extends from the clock line;
wherein the clock line, the connecting line, and the compensation pattern respectively comprise a plurality of clock lines, a plurality of connecting lines, and a plurality of compensation patterns which are connected to one another, respectively, in one-to-one correspondence; and
the plurality of compensation patterns respectively corresponding to the plurality of clock lines have different planar areas from one another.

17. The display device as claimed in claim 16, wherein the clock line is electrically connected to a compensation pattern which has a larger planar area, as the clock line is closer to the gate driver.

18. The display device as claimed in claim 17, wherein each of the plurality of compensation patterns is disposed between adjacent clock lines of the plurality of clock lines.

19. The display device as claimed in claim 16, wherein the compensation pattern has a line width greater than or equal to a line width of the clock line.

20. The display device as claimed in claim 16, wherein the compensation pattern is on a same layer as that on which the clock line is disposed.

21. A display device comprising:
a first substrate and a second substrate opposite to each other;
a gate line on the first substrate;
a gate driver which is connected to the gate line;
clock lines which transmit clock signals;
a connecting line which connects the clock line and the gate driver;
a common electrode on the second substrate, the common electrode overlapping a clock line of the clock lines and the connecting line;
a first compensation pattern which overlaps the common electrode and extends from the connecting line; and
a second compensation pattern which overlaps the common electrode and extends from another clock line of the clock lines.

22. A display device comprising:
a first substrate and a second substrate opposite to each other;
a gate line on the first substrate;
a gate driver which is connected to the gate line;
clock lines which transmit clock signals;
a connecting line which connects the clock line and the gate driver;
a common electrode on the second substrate, the common electrode overlapping a clock line of the clock lines and the connecting line;
a first compensation pattern which overlaps the common electrode and extends from the connecting line; and
a second compensation pattern which overlaps the common electrode and extends from another clock line of the clock lines;
wherein one of the first compensation pattern and the second compensation pattern connected to a clock line which is closer to the gate driver has a larger planar area than that of the other of the first compensation pattern and the second compensation pattern.

23. The display device as claimed in claim 22, wherein an odd-numbered clock line of the clock lines is connected to one of the first compensation pattern and the second compensation pattern, and an even-numbered clock line of the clock lines is connected to the other of the first compensation pattern and the second compensation pattern.

* * * * *